(12) United States Patent
Becker et al.

(10) Patent No.: US 8,592,614 B2
(45) Date of Patent: Nov. 26, 2013

(54) MIXTURES OF ORGANIC EMISSIVE SEMICONDUCTORS AND MATRIX MATERIALS, THEIR USE AND ELECTRONIC COMPONENTS COMPRISING SAID MATERIALS

(75) Inventors: Heinrich Becker, Hofheim (DE); Anja Gerhard, Egelsbach (DE); Philipp Stössel, Frankfurt (DE); Horst Vestweber, Gilserberg-Winterscheid (DE)

(73) Assignee: Merck Patent GmbH, Darmstadt (DE)

( * ) Notice: Subject to any disclaimer, the term of this patent is extended or adjusted under 35 U.S.C. 154(b) by 1600 days.

(21) Appl. No.: 10/563,716

(22) PCT Filed: Jul. 7, 2004

(86) PCT No.: PCT/EP2004/007421
§ 371 (c)(1),
(2), (4) Date: Apr. 11, 2006

(87) PCT Pub. No.: WO2005/003253
PCT Pub. Date: Jan. 13, 2005

(65) Prior Publication Data
US 2006/0255332 A1 Nov. 16, 2006

(30) Foreign Application Priority Data

Jul. 7, 2003 (DE) .................................. 103 30 761
Nov. 25, 2003 (DE) .................................. 103 55 380

(51) Int. Cl.
*C09K 11/70* (2006.01)

(52) U.S. Cl.
USPC ..... 556/16; 556/13; 252/301.36; 252/301.4 P

(58) Field of Classification Search
USPC ........ 257/40, E51.043; 136/263; 152/301.16, 152/301.35, 301.36; 313/504; 428/690, 428/917; 556/13, 16; 252/301.36, 301.4 P; 568/14

See application file for complete search history.

(56) References Cited

U.S. PATENT DOCUMENTS

| | | | |
|---|---|---|---|
| 5,840,217 A | 11/1998 | Lupo et al. | |
| 2002/0024297 A1* | 2/2002 | Kwok et al. | 313/504 |
| 2002/0055013 A1 | 5/2002 | Kim et al. | |
| 2002/0132911 A1 | 9/2002 | Rietz et al. | |
| 2003/0059646 A1 | 3/2003 | Kamatani et al. | |
| 2003/0144487 A1* | 7/2003 | Grushin et al. | 534/15 |
| 2004/0027821 A1* | 2/2004 | Pillow et al. | 362/84 |
| 2005/0167637 A1* | 8/2005 | Konemann et al. | 252/401 |
| 2006/0163562 A1* | 7/2006 | Boerner | 257/40 |
| 2006/0208221 A1 | 9/2006 | Gerhard et al. | |
| 2006/0255332 A1 | 11/2006 | Becker et al. | |

FOREIGN PATENT DOCUMENTS

| | | |
|---|---|---|
| EP | 0 676 461 A2 | 10/1995 |
| EP | 1245659 B9 * | 7/2012 |
| JP | 1995053950 A | 2/1995 |
| JP | H07-053950 | 2/1995 |
| JP | 1995109449 A | 4/1995 |
| JP | H07-109449 | 4/1995 |
| JP | 2002/063989 A | 2/2002 |
| JP | 2006/523740 T | 10/2006 |
| JP | 4773346 B2 | 9/2011 |
| WO | WO 97/20877 | 6/1997 |

OTHER PUBLICATIONS

Mekis et al., {One-Pot Synthesis of Highly Luminescent CdSe/CdS Core-Shell Nanocrystals via Organometallic and "Greener" Chemical Approaches, Journal of Physical Chemistry B (2003), 107(30), 7454-7462}.*

Riwotzki et al, {Liquid-phase synthesis of colloids and redispersible powders of strongly luminescing LaPO4:Ce,Tb nanocrystals, Angewandte Chemie, International Edition (2001), 40(3), 573-576}.*

Fukase, A. et al., "High-efficiency Organic Electroluminescent Devices Using Iridium Complex Emitter and Arylamine-containing Polymer Buffer Layer," *Polymers for Advanced Technologies*, 13(8):601-604 (2002).

Adachi, C. et al., "Architectures for Efficient Electrophosphorescent Organic Light-Emitting Devices," *IEEE Journal on Selected Topics in Quantum Electronics*, 8(2):372-377 (2002).

Chang-Lyoul, L. et al., "Highly Efficient Polymer Phosphorescent Light Emitting Devices," *Materials Science and Engineering*, 85(2-3):228-231 (2001).

Djurovich, P.I. et al., "Ir(III) Cyclometalated Complexes as Efficient Phosphorescent Emitters in Polymer Blend and Organic LEDs," *Polymer Preprints*, 41(1):770-771 (2000).

Adachi, C. et al., "High-efficiency Organic Electrophosphorescent Devices with Tris(2-phenylpyridine)Iridium Doped into Electron-Transporting Materials," *Applied Physics Letters*, 77(6):904-906 (2000).

\* cited by examiner

*Primary Examiner* — Johann R Richter
*Assistant Examiner* — Pancham Bakshi
(74) *Attorney, Agent, or Firm* — Novak Druce Connolly Bove + Quigg LLP

(57) ABSTRACT

The present invention relates to new types of material mixtures composed of at least two substances, one serving as a matrix material and the other being an emission material capable of emission and containing at least one element of atomic number greater than 20, and for their use in organic electronic components such as electroluminescent elements and displays.

17 Claims, 2 Drawing Sheets

MIXTURES OF ORGANIC EMISSIVE SEMICONDUCTORS AND MATRIX MATERIALS, THEIR USE AND ELECTRONIC COMPONENTS COMPRISING SAID MATERIALS

RELATED APPLICATIONS

This application is the U.S. National Stage of International Application No. PCT/EP2004/007421, filed Jul. 7, 2004, published in German, and claims priority under 35 U.S.C. §119 or 365 to German Application No. 103 30 761.3, filed Jul. 7, 2003 and to German Application No. 103 55 380.1, filed Nov. 25, 2003.

The present invention relates to the use of novel materials and material mixtures in organic electronic devices such as electroluminescent elements, and to their use in displays based thereon.

In a series of different types of applications which can be classified within the electronics industry in the widest sense, the use of organic semiconductors as active components (=functional materials) has become reality in recent times or is expected in the near future. For instance, light-sensitive organic materials (e.g. phthalocyanines) and organic charge transport materials (generally triarylamine-based hole transporters) have already found use for several years in copying machines.

The use of specific semiconducting organic compounds, some of which are also capable of emission of light in the visible spectral region, is just starting to be introduced onto the market, for example in organic electroluminescent devices. Their individual components, the organic light-emitting diodes (OLEDs), have a very wide spectrum of application as:

1. white or colored backlighting for monochrome or multicolor display elements (for example in pocket calculators, for mobile telephones and other portable applications),
2. large-surface area displays (for example traffic signs, billboards and other applications),
3. illumination elements in all colors and forms,
4. monochrome or full-color passive matrix displays for portable applications (for example mobile telephones, PDAs, camcorders and other applications),
5. full-color, large-surface area, high-resolution active matrix displays for a wide variety of applications (for example mobile telephones, PDAs, laptops, televisions and other applications).

The development of some of these applications is already very far advanced; nevertheless, there is still great technical need for improvement.

Devices containing relatively simple OLEDs have already been introduced onto the market, as demonstrated by the car radios from Pioneer or a digital camera from Kodak with an organic display. However, there are still considerable problems which are in need of urgent improvement:

1. For instance, the operative lifetime in particular of OLEDs is still low, so that it has only been possible to date to commercially realize simple applications.
2. Although the efficiencies of OLEDs are acceptable, even improvements are still desired here too, specifically for portable applications.
3. The aging processes are generally accompanied by a rise in the voltage. This effect makes voltage-driven organic electroluminescent devices, for example displays or display elements, difficult or impossible. However, voltage-driven addressing is more complex and costlier precisely in this case.
4. The required operating voltage is quite high specifically in the case of efficient phosphorescent OLEDs and therefore has to be reduced in order to improve the power efficiency. This is of great significance specifically for portable applications.
5. The required operating current has likewise been reduced in the last few years, but has to be reduced still further in order to improve the power efficiency. This is particularly important specifically for portable applications.
6. The multitude of layers makes the construction of OLEDs complex and technologically very complicated. It would therefore be desirable to be able to realize OLEDs with a simpler layer structure which requires fewer layers, but still have good or even improved properties.

The reasons mentioned above under 1 to 6 make improvements in the production of OLEDs necessary.

A development in this direction which has emerged in recent years is the use of organometallic complexes which exhibit phosphorescence instead of fluorescence [M. A. Baldo, S. Lamansky, P. E. Burrows, M. E. Thompson, S. R. Forrest, Applied Physics Letters, 1999, 75, 4-6]. For quantum-mechanical reasons, up to four times the quantum efficiency, energy efficiency and power efficiency are possible using organometallic compounds. Whether this new development will establish itself firstly depends strongly upon whether corresponding device compositions can be found which can also utilize these advantages (triplet emission=phosphorescence compared to singlet emission=fluorescence) in OLEDs. The essential conditions for practical use here are in particular a high operative lifetime, a high stability against thermal stress and a low use and operating voltage in order to enable mobile applications.

The general structure of organic electroluminescent devices is described, for example, in U.S. Pat. No. 4,539,507 and U.S. Pat. No. 5,151,629, and also EP 01202358.

Typically, an organic electroluminescent device consists of a plurality of layers which are applied to one another by means of vacuum methods or various printing methods. These layers are specifically:

1. A carrier plate=substrate (typically glass or plastics films).
2. A transparent anode (typically indium tin oxide, ITO).
3. A hole injection layer (Hole Injection Layer=HIL): for example based on copper-phthalocyanine (CuPc) or conductive polymers such as polyaniline (PANI) or polythiophene derivatives (such as PEDOT).
4. One or more hole transport layers (Hole Transport Layer=HTL): typically based on triarylamine derivatives, for example 4,4',4''-tris(N-1-naphthyl-N-phenylamino) triphenylamine (NaphDATA) as the first layer and N,N'-di (naphth-1-yl)-N,N'-diphenylbenzidine (NPB) as the second hole transport layer.
5. One or more emission layers (Emission Layer=EML): this layer (or layers) may coincide partly with layers 4 to 8, but consists typically of matrix materials, such as 4,4'-bis(carbazol-9-yl)biphenyl (CBP), doped with fluorescent dyes, for example N,N'-diphenylquinacridone (QA), or phosphorescence dyes, for example tris(phenylpyridyl)iridium (Ir(PPy)$_3$) or tris(2-benzothiophenylpyridyl)iridium (Ir (BTP)$_3$). However, the emission layer may also consist of polymers, mixtures of polymers, mixtures of polymers and low molecular weight compounds or mixtures of different low molecular weight compounds.
6. A hole blocking layer (Hole Blocking Layer=HBL): this layer may coincide partly with layers 7 and 8. It consists typically of BCP (2,9-dimethyl-4,7-diphenyl-1,10-phenanthroline=bathocuproin) or bis(2-methyl-8-quinolinolato)(4-phenylphenolato)aluminum(III) (BAlq).

7. An electron transport layer (Electron Transport Layer=ETL): usually based on aluminum tris-8-hydroxyquinolinate (AlQ₃).
8. An electron injection layer (Electron Injection Layer=EIL): this layer may coincide partly with layer 4, 5, 6 and 7, or a small portion of the cathode is specially treated or specially deposited.
9. A further electron injection layer (Electron Injection Layer=EIL): a thin layer consisting of a material having a high dielectric constant, for example LiF, Li₂O, BaF₂, MgO, NaF.
10. A cathode: here, generally metals, metal combinations or metal alloys having a low work function are used, for example Ca, Ba, Cs, Mg, Al, In, Mg/Ag.

This whole device is appropriately (depending on the application) structured, contacted and finally also hermetically sealed, since the lifetime of such devices is generally shortened drastically in the presence of water and/or air. The same also applies to what are known as inverted structures in which the light is emitted from the cathode. In these inverted OLEDs, the anode consists, for example, of Al/Ni/NiOx or Al/Pt/PtOx or other metal/metal oxide combinations which have a HOMO greater than 5 eV. The cathode consists of the same materials as described in point 9 and 10, with the difference that the metal, for example Ca, Ba, Mg, Al, In, etc, is very thin and thus transparent. The layer thickness is below 50 nm, better below 30 nm, even better below 10 nm. A further transparent material can also be applied to this transparent cathode, for example ITO (indium tin oxide), IZO (indium zinc oxide), etc.

Organic electroluminescent devices in which the emission layer (EML) consists of more than one substance have already been known for some time.

In the abovementioned structure, the matrix material of the emission layer (EML) plays a particular role. The matrix material has to enable or improve the charge transport of holes and/or electrons, and/or enable or improve charge carrier recombination, and, if appropriate, transfer the energy arising in the recombination to the emitter.

In the electroluminescent devices based on phosphorescent emitters, this task has to date been assumed predominantly by matrix materials which contain carbazole units.

However, matrix materials which contain carbazole units, for example the frequently used CBP, have some disadvantages in practice. These can be seen, inter alia, in the often short to very short lifetime of the devices produced with them and the frequently high operating voltages which lead to low power efficiencies. In addition, it has been found that, for energetic reasons, CBP is unsuitable for blue-emitting electroluminescent devices, which results in a very poor efficiency. Moreover, the structure of the devices is very complex when CBP is used as the matrix material, since a hole blocking layer and an electron transport layer have to be used in addition. When these additional layers are not used, as described, for example, by Adachi et al. (*Organic Electronics* 2001, 2, 37), good efficiencies are observed, but only at extremely low brightnesses, while the efficiency at higher brightness, as required for application, is lower by more than one order of magnitude. Thus, high voltages are required for high brightnesses, so that the power efficiency is very low here, which is unsuitable especially for passive matrix applications.

It has now been found that, surprisingly, the use of certain matrix materials in combination with certain emitters leads to distinct improvements over the prior art, especially in relation to the efficiency and in combination with a greatly increased lifetime. In addition, a distinctly simplified layer structure of the OLED is possible with these matrix materials, since neither a separate hole blocking layer nor a separate electron transport and/or electron injection layer has to be used.

The use of the matrix materials described below in OLEDs in combination with phosphorescent emitters is novel.

The invention therefore provides mixtures comprising
at least one matrix material A which comprises at least one structural unit of the form Q=X where the X radical has at least one nonbonding electron pair, the Q radical is P, As, Sb, Bi, S, Se or Te, and mayor may not also form glassline layers;
at least one emission material B which is capable of emission and is a compound which emits light upon suitable excitation and contains at least one element of atomic number greater than 20.

The inventive mixtures are preferably those which comprise at least one matrix material A whose glass transition temperature $T_g$ (measured as the pure substance) is greater than 70° C.

For clarity, it should be mentioned that the symbol "=" used above and below represents a double bond in the sense of the Lewis notation.

Figure 1:
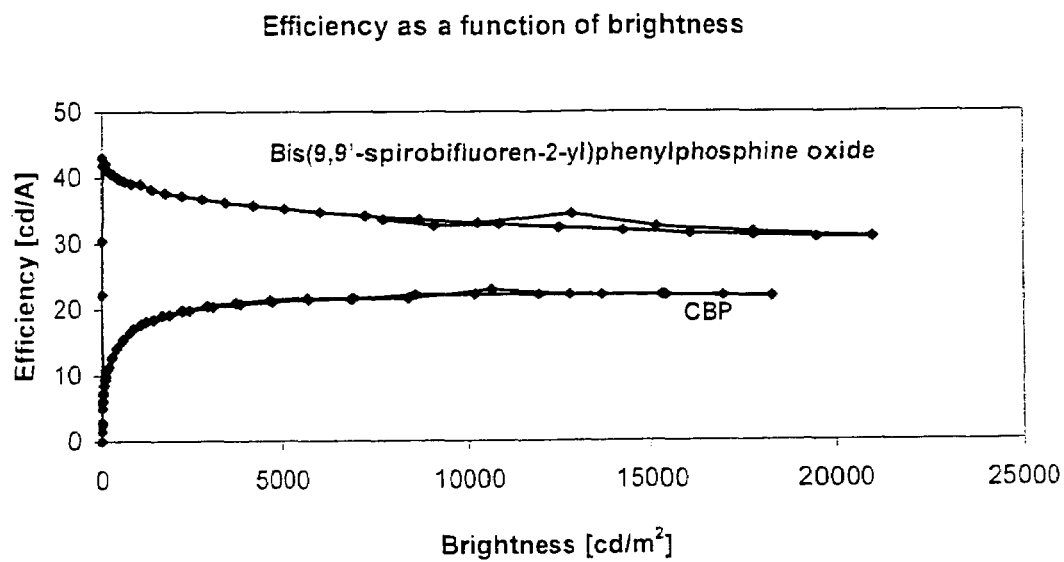
FIG. 1 illustrates OLED efficiency as a function of brightness.

The matrix material A is preferably at least one compound of the formula (1) to (4)

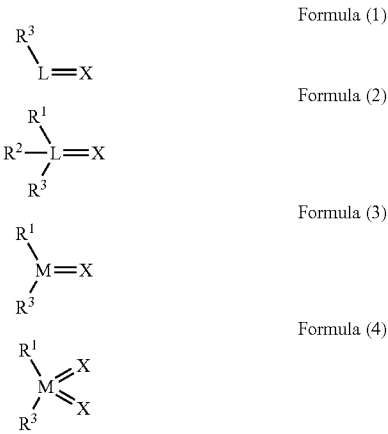

where the symbols and indices are defined as follows:
L is the same or different at each instance and is P, As, Sb or Bi;
M is the same or different at each instance and is S, Se, Te;
X is the same or different at each instance and is O, S, Se or N—R³;
R¹, R² are the same or different at each instance and are each H, F, Cl, Br, I, CN, NO₂, N(R³)₂, a straight-chain, branched or mono-, oligo- or polycyclic alkyl, alkoxy or thioalkoxy group having from 1 to 40 carbon atoms, in which one or more nonadjacent CH₂ groups may be replaced by —R⁴C=CR⁴—, —C≡C—, Si(R⁴)₂, Ge(R⁵)₂, Sn(R⁶)₂, NR⁷, C=O, C=S, C=Se, C=NR⁸, —O—, —S—, —NR⁹— or —CONR¹⁰—, and in which one or more hydrogen atoms may be replaced by F, Cl, Br, I, CN, NO$_2$, or an aromatic or heteroaromatic ring system having from 1 to 40 carbon atoms, in which one or more hydrogen atoms may be replaced by F, Cl, Br, I, CN, NO$_2$, and which may be substituted by one or more nonaromatic R$^3$ radicals, where a plurality of substituents R$^1$ and/or R$^1$ together may form a further mono- or polycyclic, aliphatic or aromatic ring system;

R$^3$ is the same or different at each instance and is a straight-chain, branched or mono-, oligo- or polycyclic alkyl, alkoxy or thioalkoxy group having from 1 to 40 carbon atoms, in which one or more nonadjacent CH$_2$ groups may be replaced by —R$^4$C=CR$^4$—, C≡C—, Si(R$^4$)$_2$, Ge(R$^5$)$_2$, Sn(R$^6$)$_2$, NR$^7$, C=O, C=S, C=Se, C=NR$^8$, —O—, —S—, —NR$^9$— or —CONR$^{10}$—, and in which one or more hydrogen atoms may be replaced by F, Cl, Br, I, CN, NO$_2$, or an aromatic or heteroaromatic ring system having from 1 to 40 carbon atoms, in which one or more hydrogen atoms may be replaced by F, Cl, Br, I, CN, NO$_2$, and which may be substituted by one or more nonaromatic R$^1$ radicals, where a plurality of substituents R$^1$ together may form a further mono- or polycyclic, aliphatic or aromatic ring system, and where R$^3$ with R$^1$ and/or R$^2$ may form a mono- or polycyclic, aliphatic or aromatic ring system;

R$^4$, R$^5$, R$^6$, R$^7$, R$^8$, R$^9$, R$^{10}$ are the same or different at each instance and are each H or an aliphatic or aromatic hydrocarbon radical having from 1 to 20 carbon atoms.

In the context of this invention, an aromatic or heteroaromatic system shall be understood to mean a system which does not necessarily contain only aromatic or heteroaromatic groups, but in which a plurality of aromatic or heteroaromatic groups may also be interrupted by a short nonaromatic unit (<10% of the atoms, preferably <5% of the atoms), for example sp$^3$-hybridized C, O, N, etc. For example, aromatic systems should thus also be understood to mean systems such as 9,9'-spirobifluorene, 9,9-diarylfluorene, triarylamine, diphenyl ether, etc.

Preference is likewise given to organic electroluminescence devices which, as matrix material A, comprise at least one compound of the formula (5) to (37)

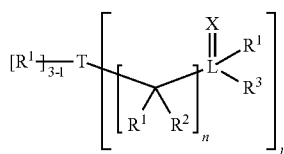

Formula (5)

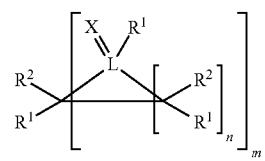

Formula (6)

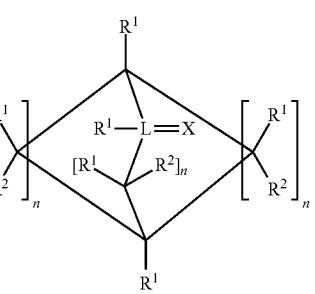

Formula (7)

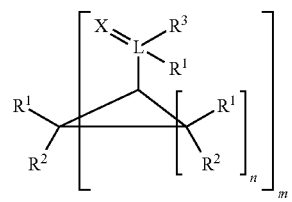

Formula (8)

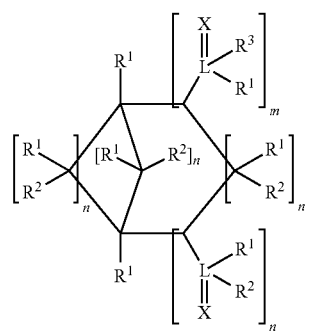

Formula (9)

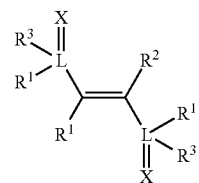

Formula (10)

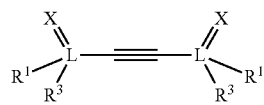

Formula (11)

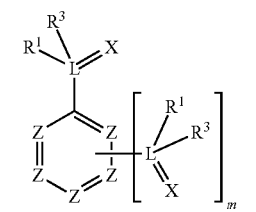

Formula (12)

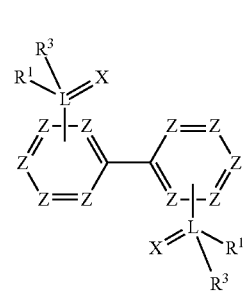

Formula (13)

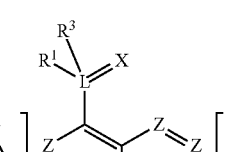

Formula (14)

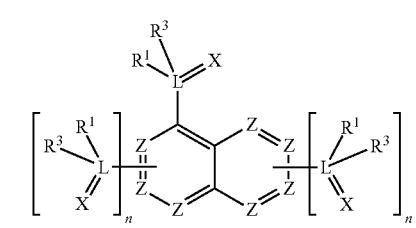

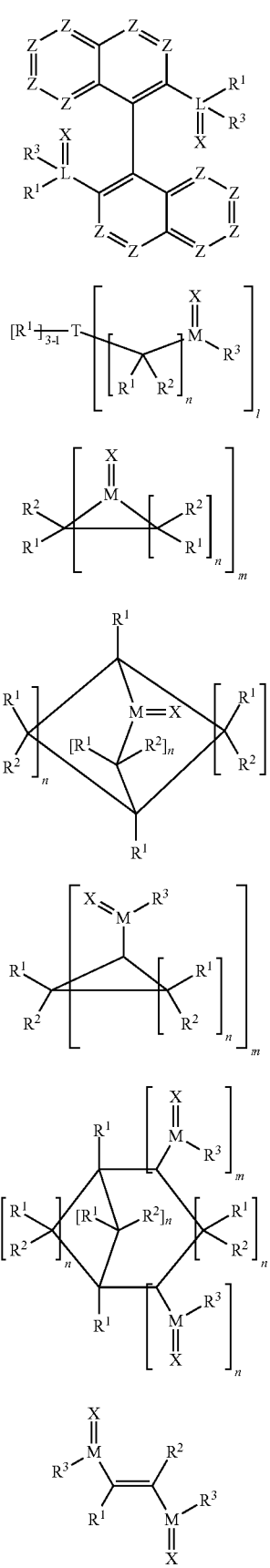

Formula (30)
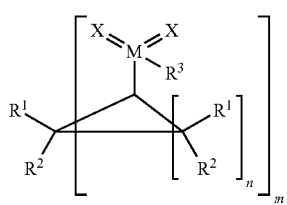

Formula (31)
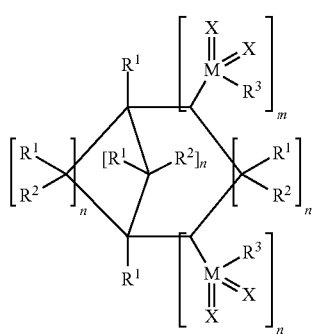

Formula (32)
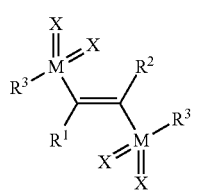

Formula (33)
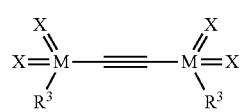

Formula (34)
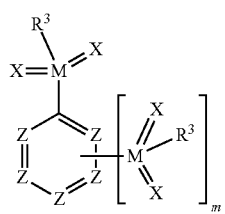

Formula (35)
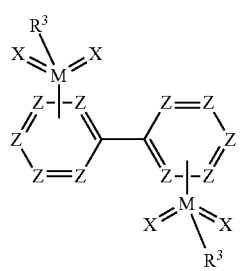

Formula (36)
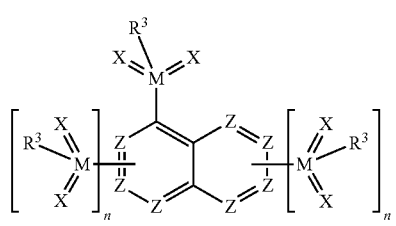

Formula (37)
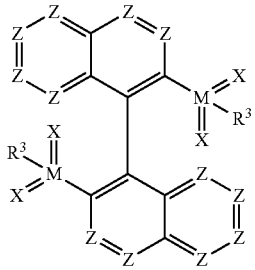

where the symbols and indices are defined as follows:

l is 1, 2 or 3;

m is 1, 2, 3, 4, 5 or 6;

n is the same or different at each instance and is 0, 1, 2, 3, 4, 5 or 6;

T is the same or different at each instance and is B, Al, $CR^1$, N, P=O, As=O, Sb=O, Bi=O;

Z is the same or different at each instance and is $CR^1$ or N;

and where the symbols L, M, X, $R^1$, $R^2$, $R^3$, $R^4$, $R^5$, $R^6$, $R^7$, $R^8$, $R^9$ and $R^{10}$ are each as defined under the formulae (1) to (4).

Preference is likewise given to a matrix material A which comprises at least one compound of the formula (38) or (39)

Formula (38)
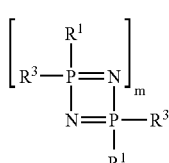

Formula (39)
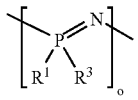

where o is from 5 to 5 000 000 and where the symbols m, $R^1$ and $R^3$ are each as defined under formula (1) to (4).

Preference is further given to inorganic phosphorus oxides and phosphorus sulfides, for example $P_4O_{10}$.

Preference is further given to a matrix material A which comprises at least one 9,9'-spirobifluorene unit.

Preference is likewise given to a matrix material A which comprises at least one compound of the formula (40) to (48)

Formula (40)
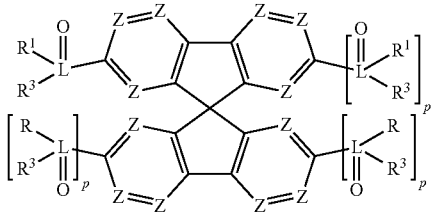

Formula (41)
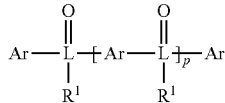

-continued

Formula (42)
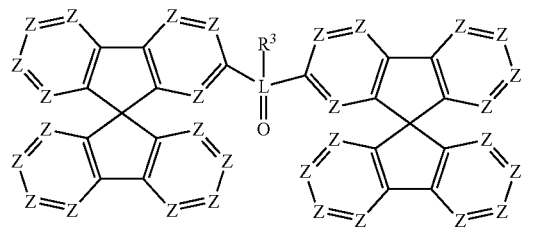

Formula (43)
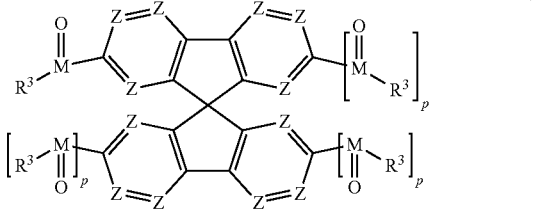

Formula (44)
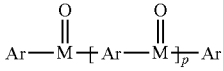

Formula (45)
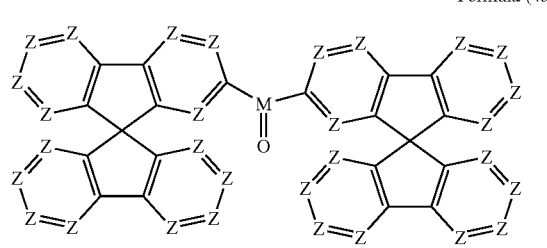

Formula (46)
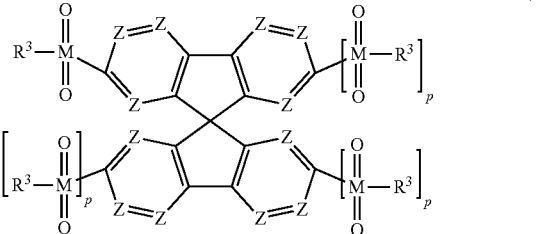

Formula (47)
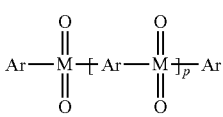

Formula (48)
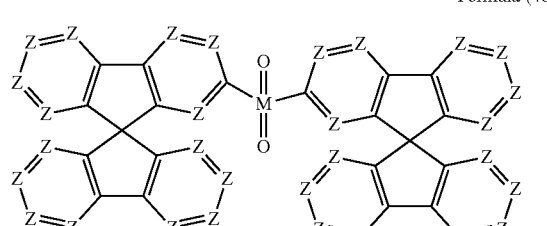

where the symbols L, M, $R^1$, $R^3$ and Z are each as defined under the formulae (1) to (37), and the further symbols and indices are:

Ar is the same or different at each instance and is a mono- or bivalent, aromatic or heteroaromatic ring system having from 2 to 40 carbon atoms, preferably having from 4 to 30 carbon atoms, in which one or more hydrogen atoms may be replaced by F, Cl, Br, I, and which may be substituted by one or more nonaromatic $R^1$ radicals, where a plurality of substituents $R^1$, either on the same ring or on different rings, together may in turn form a further mono- or polycyclic, aliphatic or aromatic ring system;

p is the same or different at each instance and is 0 or 1.

The reason for the preference for the materials of the formula (40) to (48) is in particular their high glass transition temperatures. Depending on the substitution pattern, these are typically above 70° C. and usually even above 100° C.

Particular preference is given to mixtures which comprise one or more of the matrix materials A described above by formula (1) to (48), characterized in that L is P at each instance;

M is S at each instance;

X is O at each instance;

T is the same or different at each instance and is B, $CR^1$ or P=O;

Z is the same or different at each instance and is $CR^1$ or N;

$R^1$, $R^2$, $R^3$ are the same or different at each instance and are each $CH_3$, $CF_3$, —HC=CH— or an aromatic or heteroaromatic ring system having from 1 to 40 carbon atoms, in which one or more hydrogen atoms may be replaced by F, Cl, Br, I, and which may be substituted by one or more nonaromatic $R^1$ radicals, where a plurality of substituents $R^1$ together may form a further mono- or polycyclic, aliphatic or aromatic ring system, and where $R^1$, $R^2$ and/or $R^3$ may together form a mono- or polycyclic, aliphatic or aromatic ring system;

m is 1, 2 or 3;

n is the same or different at each instance and is 0, 1, 2 or 3;

and where the symbols and indices I, o, $R^4$, $R^5$, $R^6$, $R^7$, $R^8$, $R^9$ and $R^{10}$ are each as defined above.

Particular preference is given to mixtures which comprise one or more of the matrix materials A described above by formulae (1) to (48), characterized in that they are chiral.

The compounds of the formula (40), (41a), (42), (43), (44a), (45), (46), (47a) and (48)

Formula (40)
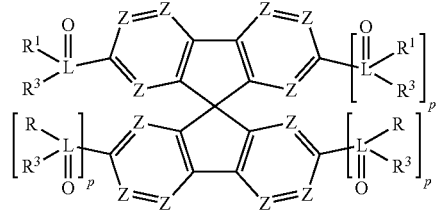

Formula (41a)
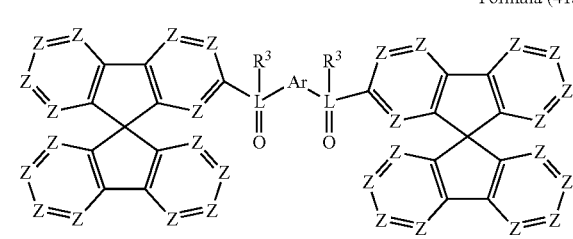

Formula (42)
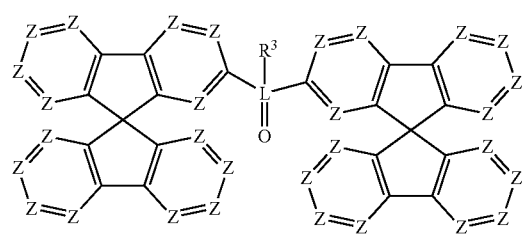

Formula (43)
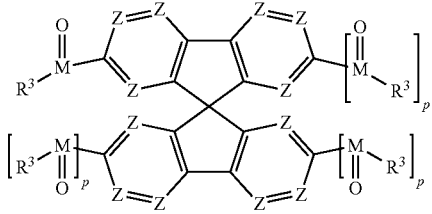

Formula (44a)
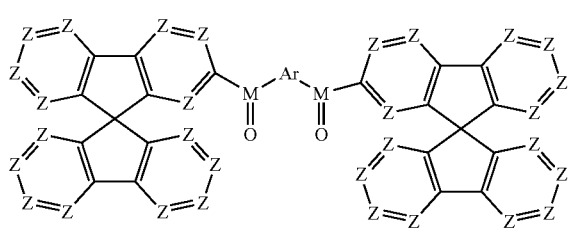

Formula (45)
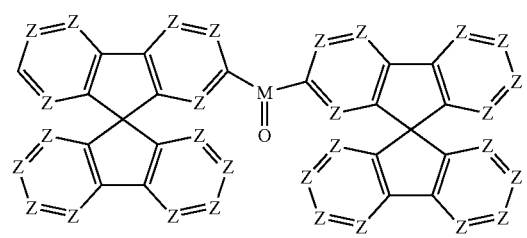

Formula (46)
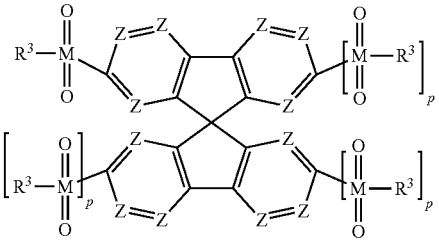

Formula (47a)
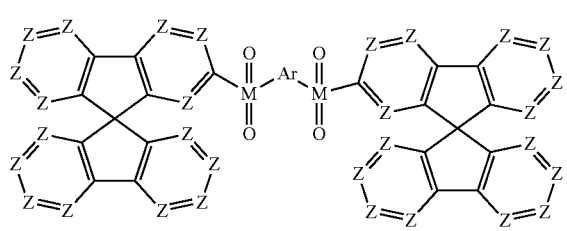

Formula (48)
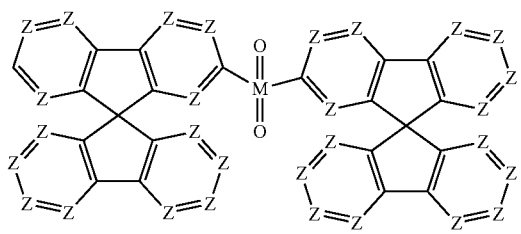

where the symbols and indices are each defined as described above, with the proviso that, in formula (43), not all p may be =1 when Z=CH and M=S and when $R^3$ is a substituted or unsubstituted phenyl group, are novel and thus likewise form part of the subject matter of the present invention.

The present invention is illustrated in detail by the following examples of matrix materials A, without any intention to restrict it thereto. Those skilled in the art can prepare further inventive matrix materials from the description and the examples adduced without any inventive activity.

Example 1
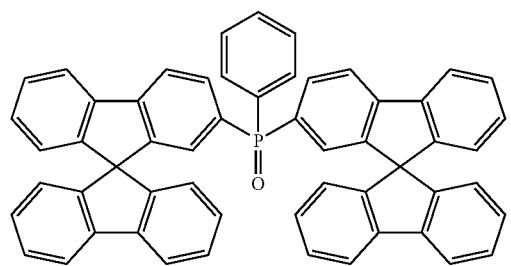

Example 2
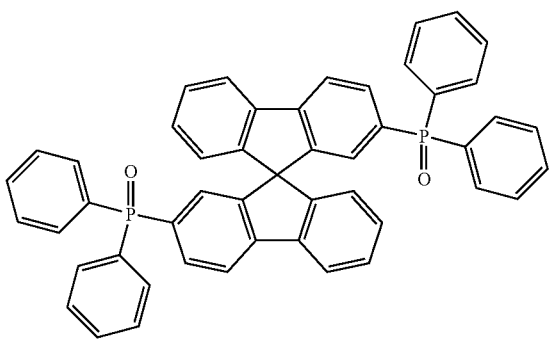

Example 3
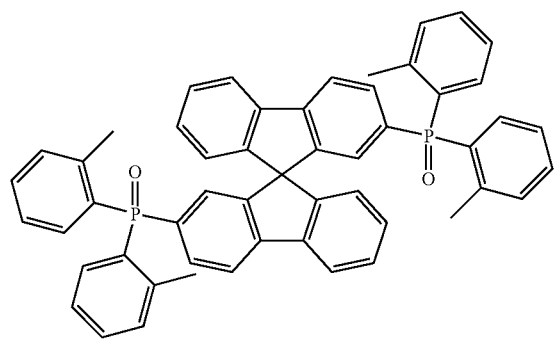
Example 4
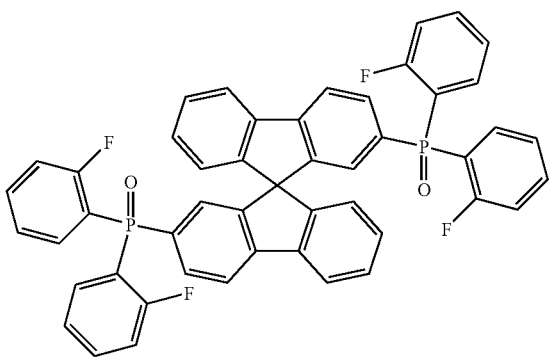
Example 5
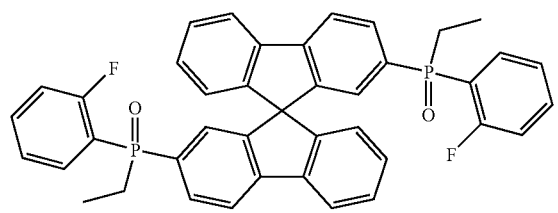
Example 6
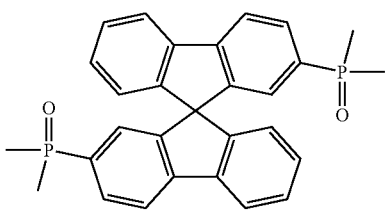
Example 7
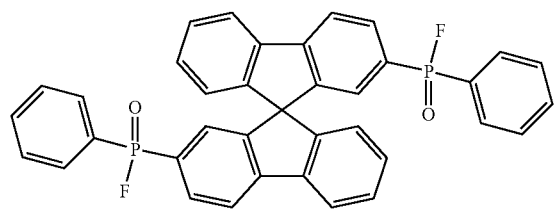
Example 8
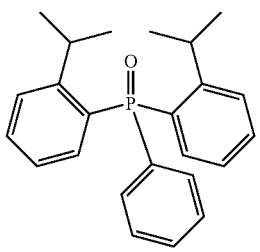
Example 9
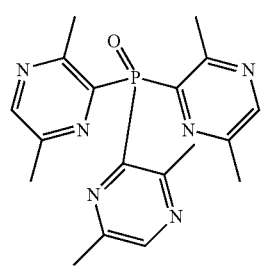
Example 10
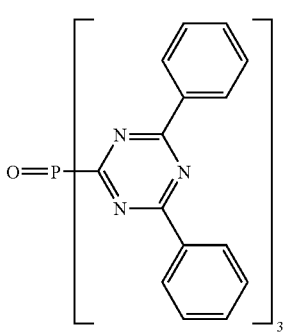
Example 11
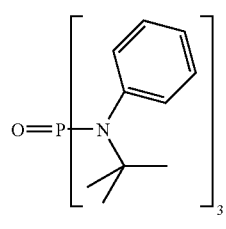
Example 12
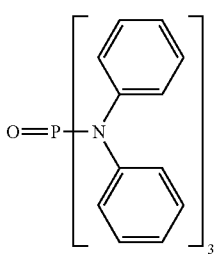

-continued
Example 13
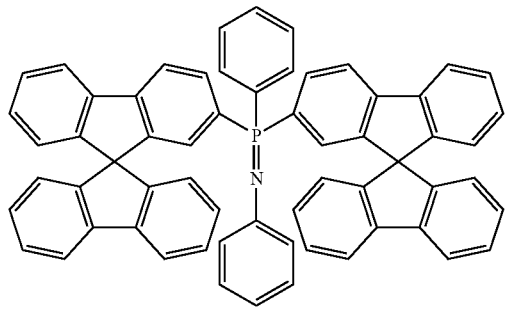
Example 14
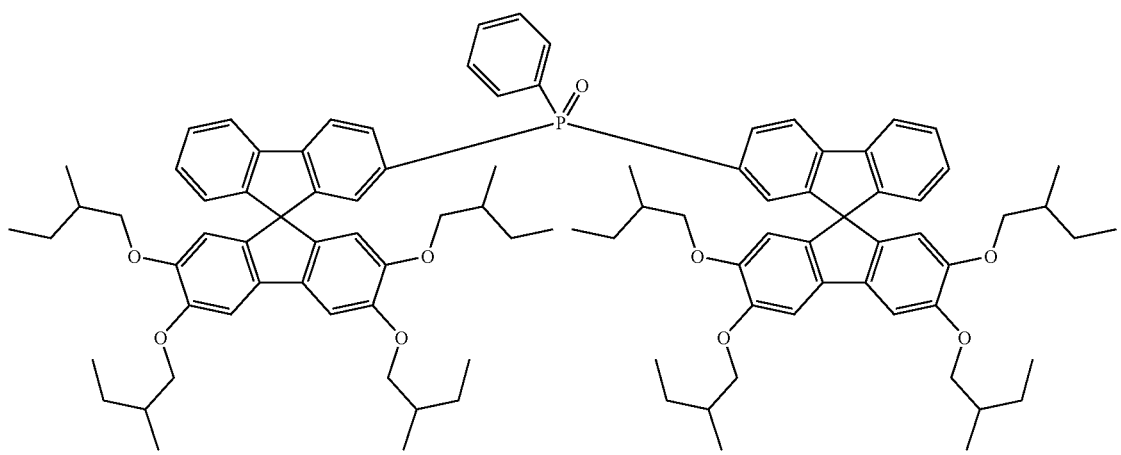
Example 15
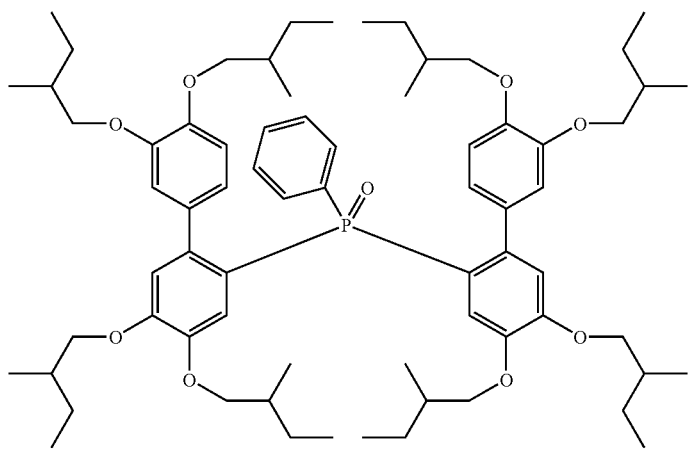
Example 16
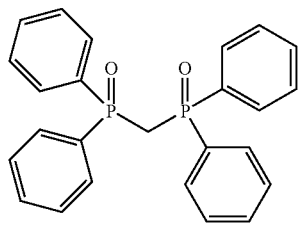
Example 17
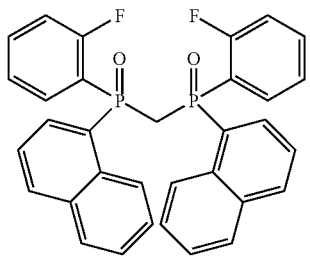

-continued
Example 18
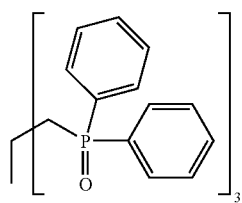
Example 19
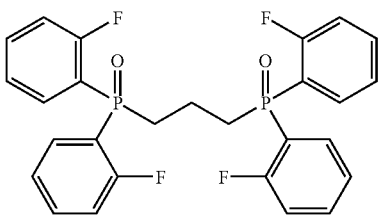
Example 20
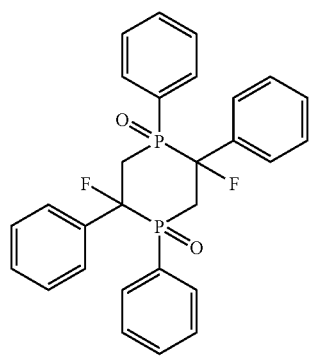
Example 21
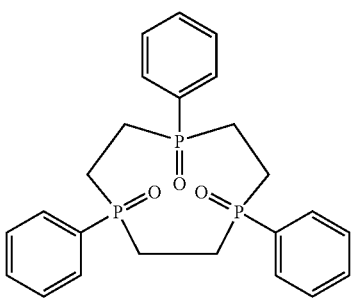
Example 22
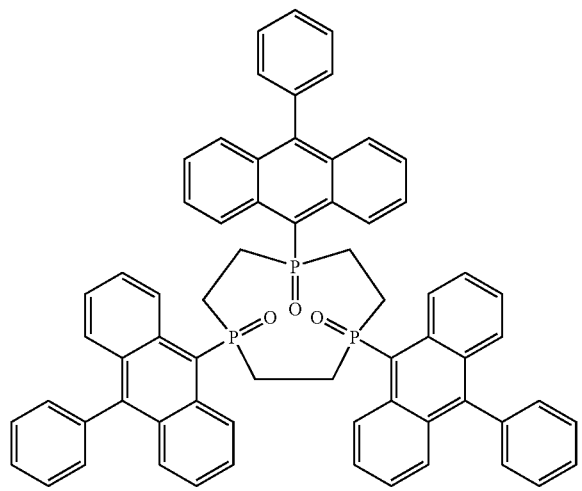
Example 23
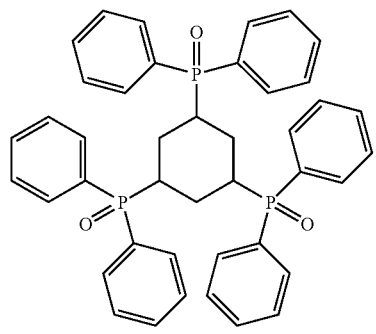
Example 24
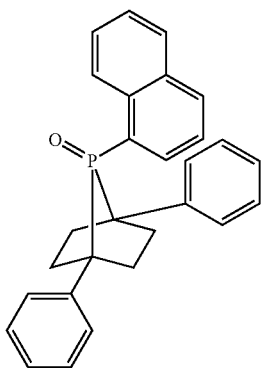

Example 25
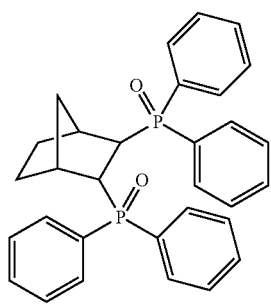
Example 26
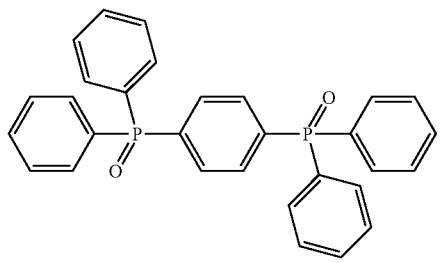
Example 27
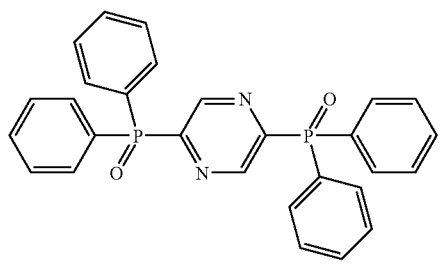
Example 28
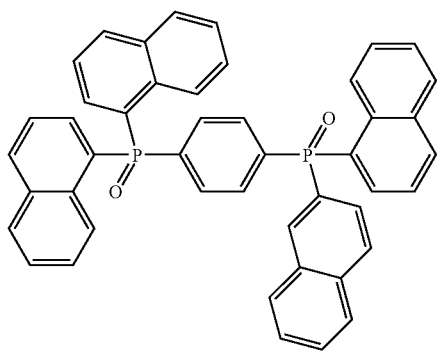
Example 29
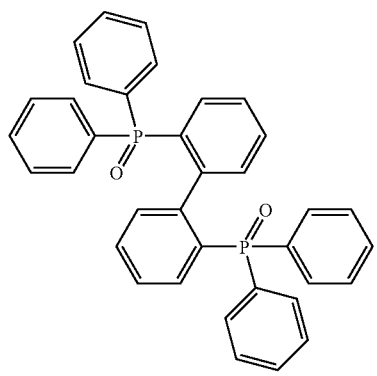
Example 30
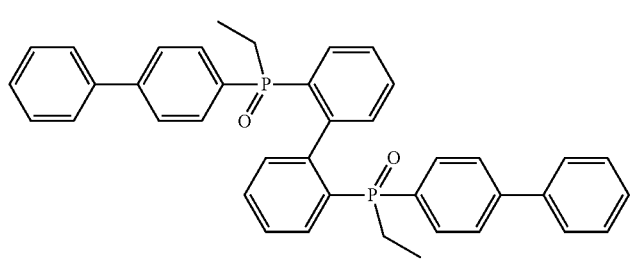
Example 31
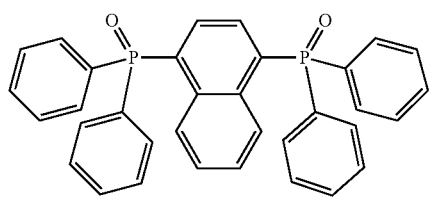
Example 32
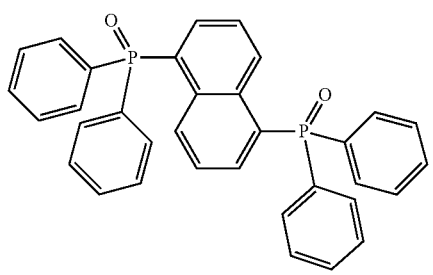

-continued
Example 33
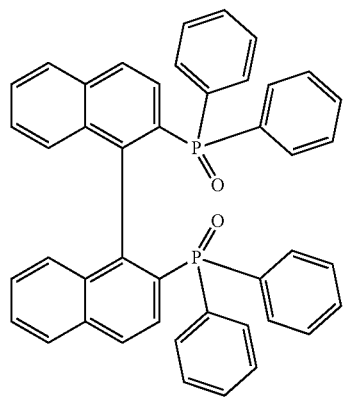
Example 34
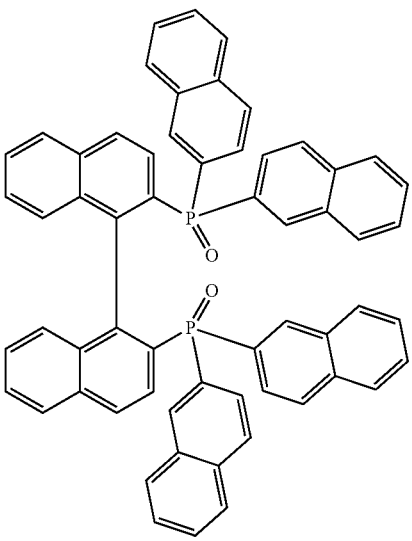
Example 35
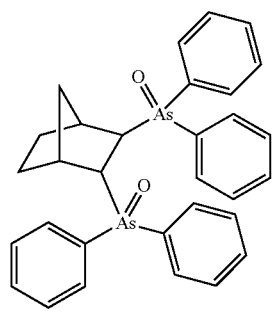
Example 36
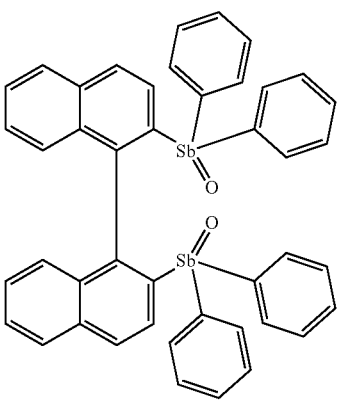
Example 37
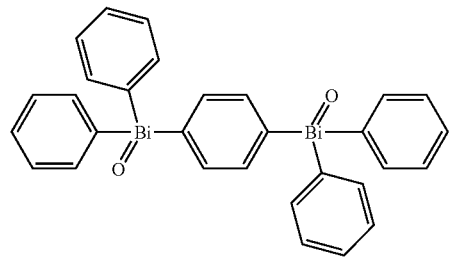
Example 38
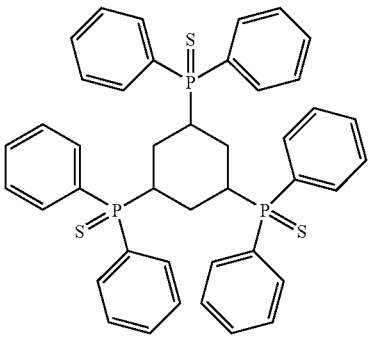
Example 39
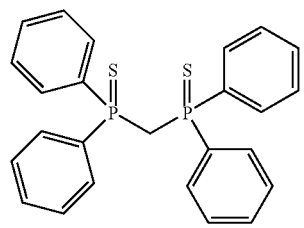
Example 40
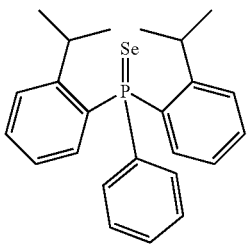

-continued
Example 41
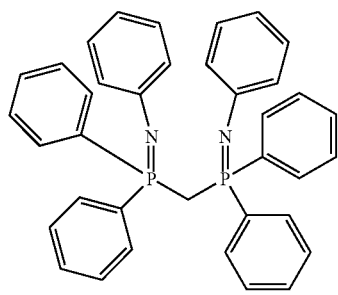
Example 42
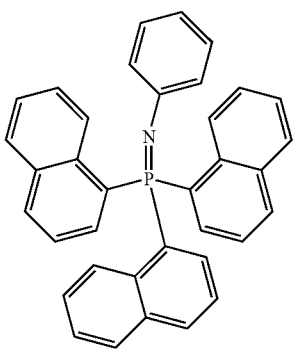
Example 43
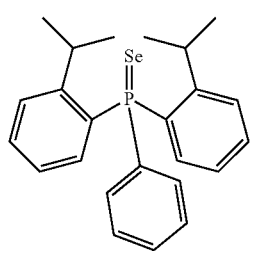
Example 44
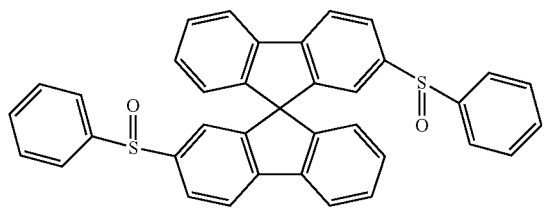
Example 45
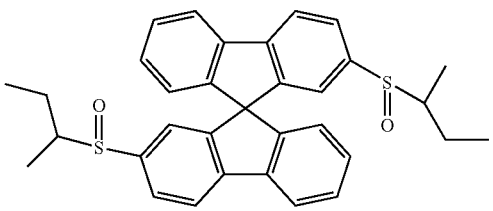
Example 46
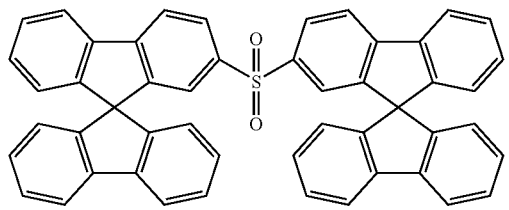
Example 47
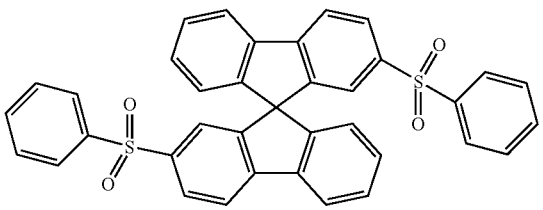
Example 48
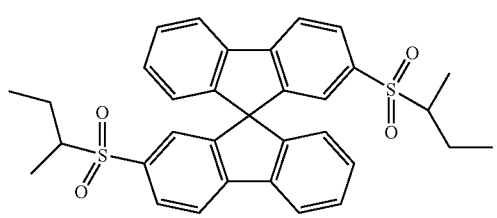
Example 49
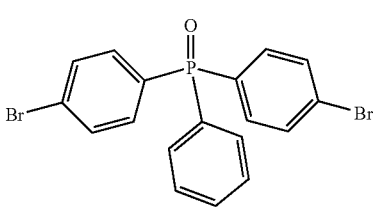
Example 50
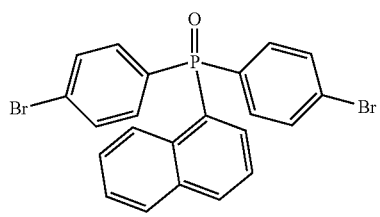
Example 51
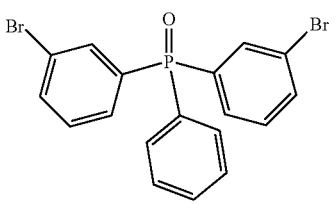
Example 52

Example 53

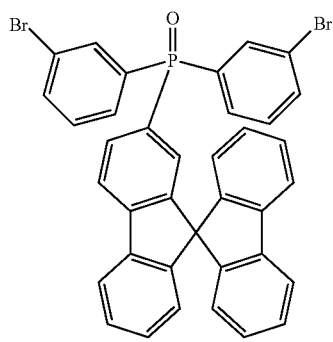

Example 54

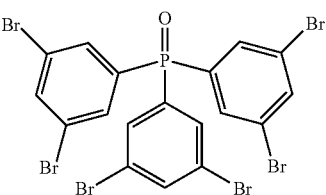

Example 55

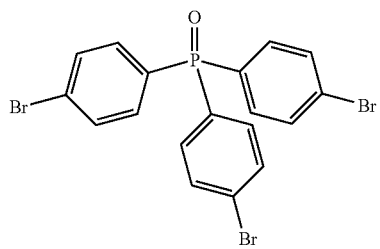

The above-described inventive matrix materials A, for example according to Examples 50 to 53, may find use, for example, as comonomers for obtaining corresponding conjugated, part-conjugated or nonconjugated polymers, or else as the core of dendrimers, for example according to Examples 54 and 55. The corresponding further functionalization (polymerization or conversion to dendrimers) is preferably effected via the halogen functionality.

Thus, the abovementioned compounds can be polymerized, inter alia, into soluble polyfluorenes (for example according to EP 842208 or WO 00/22026), polyspirobifluorenes (for example according to EP 707020 or EP 894107), polyparaphenylenes (for example according to WO 92/18552), polycarbazoles, polyvinylcarbazoles (PVK) or polythiophenes (for example according to EP 1028136).

The above-described conjugated, part-conjugated or non-conjugated polymers or dendrimers which contain one or more structural units of the formula (1) to (48) may be used as matrix material in organic electroluminescent devices.

Moreover, the inventive matrix materials A may also be functionalized further by the reaction types mentioned above, for example, and thus converted to extended matrix materials A. Here, an example is functionalization with arylboronic acids according to SUZUKI or with amines according to HARTWIG-BUCHWALD.

In order to find use as a functional material, the inventive matrix materials or mixtures thereof or the polymers or dendrimers containing matrix materials A or mixtures thereof or mixtures of the matrix materials A and the polymers or dendrimers containing matrix materials A, optionally together with the emitters B, are applied to a substrate in the form of a film by commonly known methods familiar to those skilled in the art, such as vacuum evaporation, evaporation in a carrier gas stream or else from solution by spincoating or by various printing processes (for example inkjet printing, offset printing, LITI printing, etc.).

In this context, the use of printing processes can have advantages with regard to scalability of manufacture, and also with regard to the adjustment of mixing ratios in blend layers used.

The above-described matrix materials are used in combination with phosphorescence emitters. The thus produced organic electroluminescence devices have the feature that they comprise, as the emitter B, at least one compound which is characterized in that it emits light upon suitable excitation, preferably in the visible region, and also contains at least one atom of atomic number greater than 20, preferably greater than 38 and less than 84, more preferably greater than 56 and less than 80.

The phosphorescence emitters used in the above-described organic electroluminescence devices are preferably compounds which contain molybdenum, tungsten, rhenium, ruthenium, osmium, rhodium, iridium, palladium, platinum, silver, gold or europium.

Particularly preferred mixtures comprise, as the emitter B, at least one compound of the formula (49) to (52)

Formula (49)

Formula (50)

Formula (51)

Formula (52)

where the symbols used are:

DCy is the same or different at each instance and is a cyclic group which contains at least one donor atom, preferably nitrogen or phosphorus, via which the cyclic group is bonded to the metal and which may in turn bear one or more substituents $R^{11}$; the DCy and CCy groups are bonded to one another via a covalent bond;

CCy is the same or different at each instance and is a cyclic group which contains a carbon atom via which the cyclic group is bonded to the metal and which may in turn bear one or more substituents $R^{11}$;

$R^{11}$ is the same or different at each instance and is H, F, Cl, Br, I, $NO_2$, CN, a straight-chain, branched or cyclic alkyl or alkoxy group having from 1 to 40 carbon atoms, in which one or more nonadjacent $CH_2$ groups may be replaced by C=O, C=S, C=Se, C=$NR^4$, —O—, —S—, —$NR^5$— or —$CONR^6$—, and in which one or more hydrogen atoms may be replaced by F, or an aromatic or heteroaromatic ring system which has from 4 to 14 carbon atoms and may be substituted by one or more nonaromatic $R^{11}$ radicals, in which a plurality of substituents $R^{11}$, either on the same ring or on the two different rings, together may in turn form a further mono- or polycyclic ring system;

A is the same or different at each instance and is a bidentate chelating ligand, preferably a diketonate ligand;

$R^4, R^5, R^6$ is the same or different at each instance and is H or an aliphatic or aromatic hydrocarbon radical having from 1 to 20 carbon atoms.

Examples of the above-described emitters can be taken, for example, from the applications WO 00/70655, WO 01/41512, WO 02/02714, WO 02/15645, EP 1191613, EP 1191612 and EP 1191614; these are hereby considered to be part of the application by reference.

The inventive mixture contains between 1 and 99% by weight, preferably between 3 and 95% by weight, more preferably between 5 and 50% by weight, in particular between 7 and 20% by weight, of emitter B based on the overall mixture of emitter B and matrix material A.

The present invention further provides electronic components, in particular organic electroluminescent devices (OLEDs), organic solar cells (O-SCs), organic field-effect transistors (O-FETs), organic optical detectors, organic photoreceptors in electrophotography, or else organic laser diodes (O-lasers) comprising the inventive mixture of matrix material A and emission material B.

Particular preference is given to organic electroluminescent devices which have at least one emitting layer (EML) comprising a mixture of at least one matrix material A and at least one emission material B capable of emission, where A is a compound which contains at least one structural unit of the form Q=X, characterized in that X has at least one nonbonding electron pair and may or may not also form glasslike layers, and where Q is P, As, Sb, Bi, S, Se or Te and B is a compound, characterized in that it emits upon suitable excitation and contains at least one element of atomic number greater than 20.

Preference is given to organic electroluminescent devices which contain an emitting layer (EML) comprising a mixture of at least one matrix material A and at least one emission material B capable of emission, where A is a compound which has at least one structural unit of the form Q=X, characterized in that X has at least one non-bonding electron pair, and the glass transition temperature T, of the substance A is greater than 70° C., and B is a compound, characterized in that it emits light upon suitable excitation and contains at least one element of atomic number greater than 20, and Q is as defined above.

Apart from the cathode, the anode and the emitter layer, the organic electroluminescent device may comprise further layers, for example hole injection layer, hole transport layer, hole blocking layer, electron transport layer and/or electron injection layer. However, it should be pointed out here that each of these layers need not necessarily be present. For example, it has been found that an OLED which contains neither a separate hole blocking layer nor a separate electron transport layer still exhibits very good results in electroluminescence, in particular an even higher power efficiency. This is particularly surprising since a corresponding OLED with a carbazole-containing matrix material without a hole blocking and electron transport layer only exhibits very lower power efficiencies, especially at high brightness (cf. Adachi et. al., *Organic Electronics* 2001, 2, 37).

The invention thus further provides an organic electroluminescent device comprising an inventive mixture which directly adjoins the electron transport layer without use of a hole blocking layer or which directly adjoins the electron injection layer or the cathode without use of a hole blocking layer and of an electron transport layer.

The organic electroluminescence devices exhibit higher efficiency, distinctly longer lifetime and, especially without use of a hole blocking and electron transport layer, distinctly lower operating voltages and higher power efficiencies than prior art OLEDs which use CBP as the matrix material. Omission of the hole blocking and electron transport layer also simplifies the structure of the OLED, which constitutes a considerable technological advantage.

The preferred embodiments of the inventive mixtures composed of matrix material A and emission material B also exist for the inventive electronic components, in particular for the organic electroluminescent devices (OLEDs), organic solar cells (O-SCs), organic field-effect transistors (O-FETs), organic optical detectors, organic photoreceptors for electrophotography, or else organic laser diodes (O-lasers). To avoid unnecessary repetitions, another list at this point is therefore dispensed with.

The present application text and also the examples which follow below are aimed only at organic light-emitting diodes and the corresponding displays. In spite of this restriction of the description, it is possible for those skilled in the art without any further inventive activity to prepare and employ corresponding inventive layers composed of the inventive mixtures, especially in OLED-like or related applications.

The examples described below show clearly that the inventive matrix materials lead to a distinct improvement in the efficiency and the lifetime of the electroluminescent devices produced with them.

Moreover, it is possible when the matrix materials A are used to produce blue-emitting electroluminescent devices.

EXAMPLES

General Test Method for Determining the Glass Transition Temperature

The sublimed samples were initially heated at a heating rate of 10 K/min. starting from 25° C. up to the melting point of the substance +50 K. Subsequently, they were cooled from this temperature at a heating rate of 80 K/min to 25° C. The glass transition temperature $T_g$ was measured by reheating at a heating rate of 10 K/min up to a temperature 50 K above the melting point of the substance with a Netzsch DCS 204 instrument (TASC 414/4 Controller and CC200 C Controller).

1. Synthesis of Matrix Materials

The syntheses which follow were, unless stated otherwise, carried out under a protective gas atmosphere in dried solvents. The reactants were purchased from ALDRICH [dichlorophenylphosphine]. 2-Bromo-9,9'-spirobifluorene was prepared by literature methods (Pei, Jian et al., J. Org. Chem., 2002, 67(14), 4924-4936).

Example 1

Bis(9,9'-spirobifluoren-2-yl)phenylphosphine oxide (matrix material M1)

From a solution of 98.8 g (250 mmol) of 2-bromo-9,9'-spirobifluorene and 6 ml of 1,2-dichloroethane in 1000 ml of THF and 7.1 g (290 mmol) of magnesium, the corresponding Grignard reagent was prepared at boiling. A solution of 16.3 ml (120 mmol) of dichlorophenylphosphine in 100 ml was added dropwise at 0-5° C. to this Grignard solution over 15 min. Subsequently, the mixture was heated under reflux for 1 h. After cooling, the mixture was admixed with 10 ml of water and concentrated to dryness. The colorless residue was taken up in 1000 ml of dichloromethane; the suspension was washed three times with 300 ml of water. The organic phase was removed, dried over sodium sulfate and subsequently concentrated. The colorless residue was dissolved in 1000 ml of ethyl acetate and admixed dropwise with good stirring with a mixture of 10.3 ml of hydrogen peroxide (35% by weight in water) and 100 ml of water. After stirring for 18 h, the precipitated colorless solid was filtered off with suction, washed with ethanol and dried. The solid was recrystallized three times from chlorobenzene (10 ml/g) and subsequently sublimed under high vacuum (T=385° C., p=5×10$^{-5}$ mbar). The yield at a purity of >99.9% by HPLC was 40.1 g (53 mmol), corresponding to 42.4% of theory.

Melting point: $T_m$=334° C., glass transition point: $T_g$=161° C.

$^{31}$P NMR (CDCl$_3$): δ [ppm]=30.4 (s).

$^1$H NMR (CDCl$_3$): δ [ppm]=7.83-7.81 (m, 2H), 7.76-7.75 (m, 6H), 7.38-7.22 (m, 15H), 7.15-7.12 (m, 2H), 7.06-7.03 (m, 4H), 6.72-6.71 (m, 2H), 6.64-6.60 (m, 4H).

Example 2

Bis(9,9'-spirobifluoren-2-yl)sulfoxide (matrix material M2)

110 ml (275 mmol) of an n-butyllithium solution (2.5 M in hexane) were added dropwise to a suspension, cooled to −78° C., of 98.8 g (250 mmol) of 2-bromo-9,9'-spirobifluorene in 1500 ml of THF at such a rate that the temperature did not rise above −65° C. The reaction mixture was stirred at −78° C. for 3 h and then admixed dropwise with a mixture of 7.2 ml (125 mmol) of thionyl chloride and 300 ml of THF, and subsequently stirred at −78° C. for a further 3 h. After the reaction mixture had been warmed to room temperature, the reaction mixture was admixed with 25 ml of water and concentrated to dryness under reduced pressure. The residue was taken up in 1000 ml of dioxane and 500 ml of water, and the organic phase was removed, washed once more with 500 ml of water and subsequently dried over magnesium sulfate. Subsequently, the solid which remained after concentration of the organic phase was recrystallized five times from dioxane (1 g/ml) and then sublimed under high vacuum (T=370° C., p=5×10$^{-5}$ mbar). The yield at a purity of >99.9% by HPLC was 114.0 g (168 mmol), corresponding to 67.2% of theory.

Melting point: $T_m$=365° C., glass transition point: $T_g$=178° C.

$^1$H NMR (CDCl$_3$): δ [ppm]=7.83 (m, 4H), 7.75 (m, 2H), 7.73 (m, 2H), 7.37-7.29 (br. m, 8H), 7.09-7.03 (br. m, 6H), 6.86 (m, 2H), 6.70 (m, 4H), 6.65 (m, 2H).

Example 3

1,1'-Binaphthyl-2,2'-bis(diphenylphosphine oxide) (matrix material M3)

The synthesis was carried out by oxidation of racemic 1,1'-binaphthyl-2,2'-bis(diphenylphosphine) (obtained from Aldrich) with hydrogen peroxide in analogy to Example 1.

For the sake of clarity, the matrix materials M1 to M3 are depicted once again below:

Matrix material M1

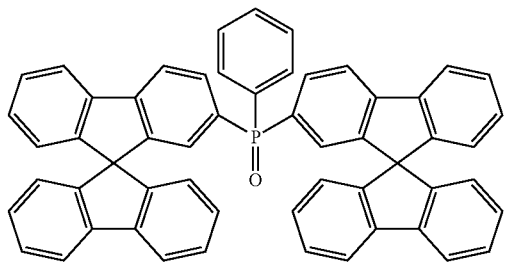

Matrix material M2

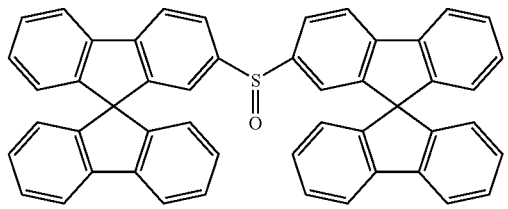

Matrix material M3

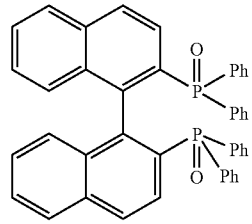

2. Production and Characterization of Organic Electroluminescent Devices which Comprise Inventive Compounds OLEDs were produced by the general process outlined below. This of course had to be adapted in the individual case to the particular circumstances (for example layer thickness variation in order to achieve optimal efficiency and color).

Inventive electroluminescent devices can be prepared, for example, as described in the application DE 10317556.3 which has not been laid open.

3. Device Examples

These examples compare the results of different OLEDs. The basic structure, the materials used, the degree of doping and the layer thicknesses were identical for the example experiments for better comparability. Only the host material in the emitter layer was changed.

The first example describes a comparative standard according to the prior art, in which the emitter layer consists of the host material CBP and the guest material Ir(PPy)$_3$. In addition, an OLED with an emitter layer consisting of the host material bis(9,9'-spirobifluoren-2-yl)phenylphosphine oxide (synthesis: see Example 1) and the guest material Ir(PPy)₃ (synthesized according to WO 02/060910) is described, as are OLEDs with further inventive host materials. OLEDs with the following structure were obtained:

PEDOT 60 nm (spincoated from water; PEDOT purchased from H. C. Starck; poly[3,4-ethylenedioxy-2,5-thiophene])

NaphDATA 20 nm (applied by vapor deposition; NaphDATA purchased from SynTec; 4,4',4"-tris(N-1-naphthyl-N-phenylamino)triphenylamine)

S-TAD 20 nm (applied by vapor deposition; S-TAD prepared according to WO99/12888; 2,2',7,7'-tetrakis(diphenylamino)spirobifluorene)

Emitter Layer:

CPB 20 nm (applied by vapor deposition; CPB purchased from ALDRICH and purified further, finally sublimed twice more; 4,4'-bis(N-carbazolyl)biphenyl) (comparative standard)

OR:

Bis(9,9'-spirobifluoren-2-yl)phenylphospine oxide 20 nm (applied by vapor deposition; synthesized and purified according to Example 1)

OR:

Bis(9,9'-spirobifluoren-2-yl)sulfoxide 20 nm (applied by vapor deposition; synthesized and purified according to Example 2)

OR:

1,1'-Binaphthyl-2,2'-bis(diphenyl-phosphine oxide) 20 nm (applied by vapor deposition; synthesized and purified according to Example 3);

each doped with 15% triplet emitter:

Ir(PPy)₃ (applied by vapor deposition; synthesized according to WO 02/060910)

BCP 10 nm (applied by vapor deposition; BCP purchased from ABCR, used as obtained; 2,9-dimethyl-4,7-diphenyl-1,10-phenanthroline); not used in all examples;

AlQ₃ 10 nm (applied by vapor deposition: AlQ₃ purchased from SynTec; tris(quinolinolato)aluminum(III)); not used in all examples Ba—Al 3 nm of Ba, 150 nm of Al thereon as the cathode.

These OLEDs which were yet to be optimized were characterized in a standard manner; for this purpose, the electroluminescence spectra, the efficiency (measured in cd/A) as a function of brightness, calculated from current-voltage-brightness characteristics (IUL characteristics), and the lifetime were determined.

Electroluminescence Spectra:

The OLEDs, both of the comparative standard (OLED with CBP) and the OLEDs with bis(9,9'-spirobifluoren-2-yl)phenylphosphine oxide, with bis(9,9'-spirobifluoren-2-yl)sulfoxide and with 1,1'-binaphthyl-2,2'-bis(diphenylphosphine oxide) as the host material exhibit green emission resulting from the Ir(PPy)₃ dopant.

Efficiency as a Function of Brightness:

For OLEDs produced with the CBP host material (Table 1, Example 1), typically an efficiency of from about 20 to 25 cd/A is obtained under the conditions described above, and 4.8 V are required for the reference luminance of 100 cd/m². In contrast, OLEDs produced with the bis(9,9'-spirobifluoren-2-yl)phenylphosphine oxide host material exhibit a maximum efficiency of over 40 cd/A, and the required voltage for the reference luminance of 100 cd/m² is lowered even to 4.0 V (FIG. 1 and Table 1, Example 2a).

Figure 2:
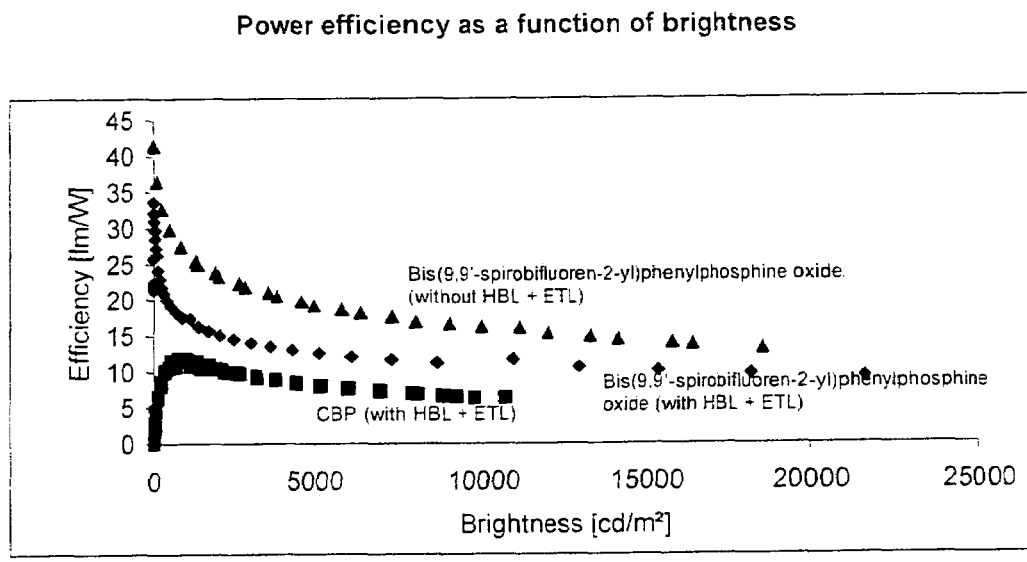
FIG. 2 illustrates OLED power efficiency as a function of brightness.

Especially when neither a hole blocking layer (HBL) nor an electron transport layer (ETL) is used, when the doped matrix (EML) thus adjoins the cathode and the electron injection layer, particularly high power efficiencies (measured in lm/W) are achieved, as depicted in FIG. 2 (see also Table 1, Example 2a). Thus, in the comparative standard (using BCP as the hole blocking layer and AlQ₃ as the electron transport layer), a maximum power efficiency of 12 lm/W is achieved. Bis(9,9'-spirobifluoren-2-yl)phenylphosphine oxide, likewise with use of BCP and AlQ₃, achieves a maximum power efficiency of 34 lm/W, while, without use of BCP and AlQ₃, i.e. when the doped matrix (EML) directly adjoins the cathode, a maximum power efficiency of 42 lm/W is achieved (Table 1, Example 2b). At a brightness of 100 cd/m², the power efficiency is still 16 lm/W (with use of an HBL and an ETL) and 25 lm/W when the doped matrix (EML) directly adjoins the cathode. Further OLEDs with bis(9,9'-spirobifluoren-2-yl)sulfoxide (Example 3a and 3b) and 1,1'-binaphthyl-2,2'-bis(diphenylphosphine oxide) (Example 4a and 4b) and as the host material exhibit, both with HBL and ETL and without HBL and ETL, an improved efficiency in comparison to OLEDs with CBP (Example 1) as the host material. All examples are compiled in Table 1.

Figure 3:
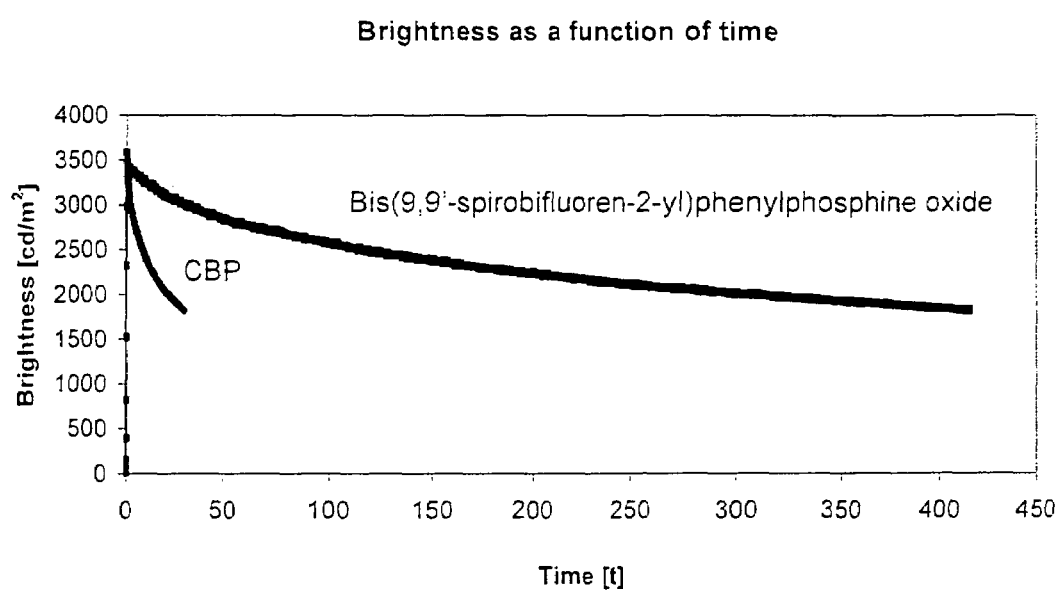
FIG. 3 illustrates OLED profile of brightness as a function of time.

Lifetime Comparison:

The two lifetime curves with BCP and bis(9,9'-spirobifluoren-2-yl)phenylphosphine oxide, each with use of an HBL and of an ETL, were shown in the same figure for better comparability (FIG. 3). The figure shows the profile of brightness, measured in cd/m², with time. The lifetime refers to the time after which 50% of the starting luminance is attained. At the brightnesses shown for CBP as the host material, a lifetime of approx. 30 h is obtained at a starting brightness of 3500 cd/m², which corresponds to an accelerated measurement, since the starting brightness is distinctly above the brightness which is required for typical active matrix-driven display applications.

For bis(9,9'-spirobifluoren-2-yl)phenylphosphine oxide, a lifetime of approx. 400 h is obtained for the same starting brightness, which corresponds to a lifetime of about 25 000 h at 500 cd/m² and an increase in the lifetime by a factor of more than 10 compared to OLEDs with CPB as the matrix material. The lifetime without use of an HBL and of an ETL, when the doped matrix is thus in direct contact with the cathode, is comparable. Further OLEDs with bis(9,9'-spirobifluoren-2-yl)sulfoxide (Example 3a and 3b) and 1,1'-binaphthyl-2,2'-bis(diphenylphosphine oxide) (Example 4a and 4b) as the host material exhibit, both with HBL and ETL and without HBL and ETL, likewise an improved lifetime in comparison to OLEDs with CBP (Example 1) as the host material. All examples are compiled in Table 1.

| Experiment | EML | HBL | ETL | Max. efficiency (cd/A) | Max. power efficiency (lm/W) | Voltage (V) at 100 cd/m² | Lifetime (h) at 10 mA/cm² |
|---|---|---|---|---|---|---|---|
| Example 1a) comparison | CBP: 15% Ir(ppy)₃ (20 nm) | BCP 10(nm) | AlQ₃ (10 nm) | 22 | 12 | 4.8 | 30 |
| Example 1b) comparison | CBP: 15% Ir(ppy)₃ (40 nm) | | | 13 | 7 | 6.1 | 25 |

| Experiment | EML | HBL | ETL | Max. efficiency (cd/A) | Max. power efficiency (lm/W) | Voltage (V) at 100 cd/m² | Lifetime (h) at 10 mA/cm² |
|---|---|---|---|---|---|---|---|
| Example 2a) | M1: 15% Ir(ppy)₃ (20 nm) | BCP 10(nm) | AlQ₃ (10 nm) | 42 | 34 | 4.0 | 400 |
| Example 2b) | M1: 15% Ir(ppy)₃ (40 nm) | | | 42 | 45 | 3.0 | 390 |
| Example 3a) | M2: 15% Ir(ppy)₃ (20 nm) | BCP 10(nm) | AlQ₃ (10 nm) | 28 | 25 | 4.6 | 180 |
| Example 3b) | M2: 15% Ir(ppy)₃ (40 nm) | | | 31 | 29 | 3.5 | 150 |
| Example 4a) | M3: 15% Ir(ppy)₃ (20 nm) | BCP 10(nm) | AlQ₃ (10 nm) | 25 | 13 | 5.4 | 310 |
| Example 4b) | M3: 15% Ir(ppy)₃ (40 nm) | | | 29 | 23 | 4.4 | 280 |

Legend:
M1 = Bis(9,9'-spirobifluoren-2-yl)phenylphosphine oxide
M2 = Bis(9,9'-spirobifluoren-2-yl)sulfoxide
M3 = 1,1'-Binaphthyl-2,2'-bis(diphenylphosphine oxide)

What is claimed is:

1. A mixture comprising
at least one matrix material A which comprises at least one compound of the formula (2):

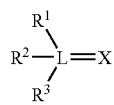

Formula (2)

where the symbols and indices are defined as follows:
X is the same or different at each instance and is O, S, Se or N—R³;
L is the same or different at each instance and is P, As, Sb or Bi;
R¹, R² are the same or different at each instance and are each H, F, Cl, Br, I, CN, NO₂, N(R³)₂, a straight-chain, branched or mono-, oligo- or polycyclic alkyl, alkoxy or thioalkoxy group having from 1 to 40 carbon atoms, in which one or more nonadjacent CH₂ groups may be replaced by —R⁴C═CR⁴—, —C≡C—, Si(R⁴)₂, Ge(R⁵)₂, Sn(R⁶)₂, NR⁷, C═O, C═S, C═Se, C═NR⁸, —O—, —S—, —NR⁹— or —CONR¹⁰—, and in which one or more hydrogen atoms may be replaced by F, Cl, Br, I, CN, NO₂, or an aromatic or heteroaromatic ring system having from 1 to 40 carbon atoms, in which one or more hydrogen atoms may be replaced by F, Cl, Br, I, CN, NO₂, and which may be substituted by one or more nonaromatic R³ radicals, where a plurality of substituents R¹ together may form a further mono- or polycyclic, aliphatic or aromatic ring system;
R³ is the same or different at each instance and is a straight-chain or branched or mono-, oligo- or polycyclic alkyl, alkoxy or thioalkoxy group having from 1 to 40 carbon atoms, in which one or more nonadjacent CH₂ groups may be replaced by —R⁴C═CR⁴—, —C≡C—, Si (R⁴)₂, Ge(R⁵)₂, Sn(R⁶)₂, NR⁷, C═O, C═S, C═Se, C═NR⁸, —O—, —S—, —NR⁹— or —CONR¹⁰—, and in which one or more hydrogen atoms may be replaced by F, Cl, Br, I, CN, NO₂, or an aromatic or heteroaromatic ring system having from 1 to 40 carbon atoms, in which one or more hydrogen atoms may be replaced by F, Cl, Br, I, CN, NO₂, and which may be substituted by one or more nonaromatic R¹ radicals, where a plurality of substituents R¹ together may form a further mono- or polycyclic, aliphatic or aromatic ring system, and where R³ with R¹ and/or R² may form a mono- or polycyclic, aliphatic or aromatic ring system;
R⁴, R⁵, R⁶, R⁷, R⁸, R⁹, R¹⁰ are the same or different at each instance and are each H or an aliphatic or aromatic hydrocarbon radical having from 1 to 20 carbon atoms, and
at least one emission material B comprising at least one compound of the formula (49) to (52)

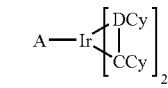

Formula (49)

Formula (50)

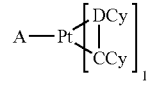

Formula (51)

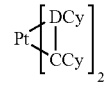

Formula (52)

where the symbols used are:
DCy is the same or different at each instance and is a cyclic group which contains at least one nitrogen or phosphorus atom via which the cyclic group DCy is bonded to the metal and, further wherein the group DCy is optionally substituted with one or more substituents R¹¹;
CCy is the same or different at each instance and is a cyclic group which contains a carbon atom via which the cyclic group CCy is bonded to the metal and, further wherein the groups CCy is optionally substituted with one or more substituents R¹¹; wherein the DCy and CCy groups are bonded to one another via a covalent bond;
R¹¹ is the same or different at each instance and is H, F, Cl, Br, I, NO₂, CN, a straight-chain, branched or cyclic alkyl or alkoxy group having from 1 to 40 carbon atoms, in which one or more nonadjacent CH₂ groups may be replaced by C═O, C═S, C═Se, C═NR⁴, —O—, —S—, —NR⁵— or —CONR⁶—, and in which one or more hydrogen atoms may be replaced by F, or an aromatic or heteroaromatic ring system which has from 4 to 14 carbon atoms and may be substituted by one or more nonaromatic $R^{11}$ radicals, in which a plurality of substituents $R^{11}$, either on the same ring or on the two different rings, together may in turn form a further mono- or polycyclic ring system;

A is the same or different at each instance and is a bidentate chelating ligand;

$R^4$, $R^5$, $R^6$ is the same or different at each instance and is H or an aliphatic or aromatic hydrocarbon radical having from 1 to 20 carbon atoms.

2. The mixture as claimed in claim 1, characterized in that the matrix material A has a glass transition temperature $T_g$, measured as the pure substance, of greater than 70° C.

3. An electronic component comprising at least one mixture as claimed in claim 1.

4. The electronic component as claimed in claim 3, characterized in that it is an organic light-emitting diode (OLED), an organic integrated circuit (O—IC), an organic field-effect transistor (OFET), an organic thin-film transistor (OTFT), an organic solar cell (O—SC), an organic optical detector, an organic photoreceptor in electrophotography or an organic laser diode (O-lasers).

5. The electronic component as claimed in claim 3, characterized in that the mixture directly adjoins an electron transport layer without use of a separate hole blocking layer.

6. The electronic component as claimed in claim 3, characterized in that the mixture directly adjoins an electron injection layer or a cathode without use of a separate hole blocking layer and of a separate electron transport layer.

7. The electronic component as claimed in claim 3, characterized in that the electronic component is an organic light-emitting diode (OLED) which comprises at least one hole blocking layer and/or at least one electron transport layer and/or at least one electron injection layer and/or further layer.

8. The mixture as claimed in claim 1, characterized in that the matrix material A used is at least one compound of the formula (5) to (15)

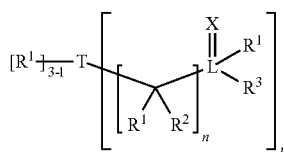

Formula (5)

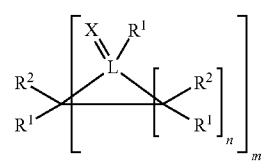

Formula (6)

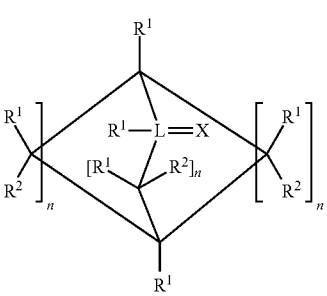

Formula (7)

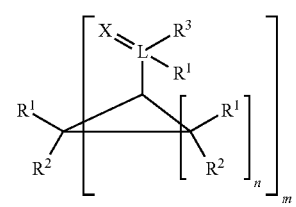

Formula (8)

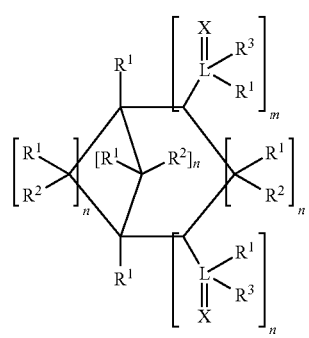

Formula (9)

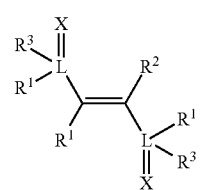

Formula (10)

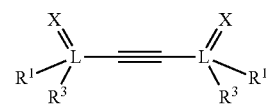

Formula (11)

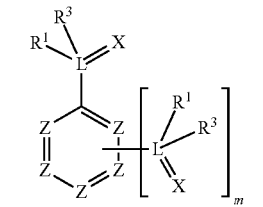

Formula (12)

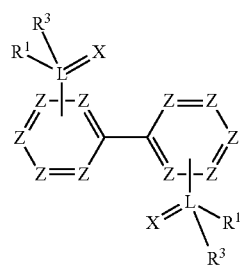

Formula (13)

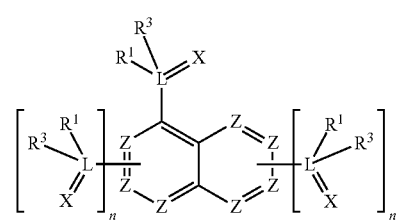

Formula (14)

Formula (15)

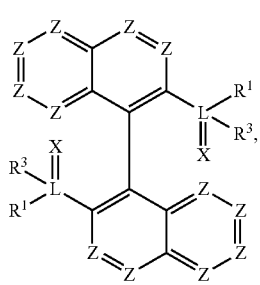

where the symbols and indices are defined as follows:
l is 1, 2 or 3;
m is 1, 2, 3, 4, 5 or 6;
n is the same or different at each instance and is 0, 1, 2, 3, 4, 5 or 6;
T is the same or different at each instance and is B, Al, CR$^1$, N, PO, As=O, Sb=O or Bi=O;
Z is the same or different at each instance and is CR$^1$ or N;
and where the symbols and indices are defined as follows:
X is the same or different at each instance and is O, S, Se or N—R$^1$;
L is the same or different at each instance and is P, As, Sb or Bi;
R$^1$, R$^2$ are the same or different at each instance and are each H, F, Cl, Br, I, CN, NO$_2$, N(R$^3$)$_2$, a straight-chain, branched or mono-, oligo- or polycyclic alkyl, alkoxy or thioalkoxy group having from 1 to 40 carbon atoms, in which one or more nonadjacent CH$_2$ groups may be replaced by R$^4$C=CR$^4$—, —C≡C—, Si(R$^4$)$_2$, Ge(R$^5$)$_2$, Sn(R$^6$)$_2$, NR$^7$, C=O, C=S, C=Se, C=NR$^8$, —O—, —S—, —NR$^9$— or —CONR$^{10}$—, and in which one or more hydrogen atoms may be replaced by F, Cl, Br, I, CN, NO$_2$, or an aromatic or heteroaromatic ring system having from 1 to 40 carbon atoms, in which one or more hydrogen atoms may be replaced by F, Cl, Br, I, CN, NO$_2$, and which may be substituted by one or more nonaromatic R$^3$ radicals, where a plurality of substituents R$^1$ together may form a further mono- or polycyclic, aliphatic or aromatic ring system;
R$^3$ is the same or different at each instance and is a straight-chain or branched or mono-, oligo- or polycyclic alkyl, alkoxy or thioalkoxy group having from 1 to 40 carbon atoms, in which one or more nonadjacent CH$_2$ groups may be replaced by R$^4$C=CR$^4$—, —C≡C—, Si(R$^4$)$_2$, Ge(R$^5$)$_2$, Sn(R$^6$)$_2$, NR$^7$, C=O, C=S, C=Se, C=NR$^8$, —O—, —S—, —NR$^9$— or —CONR$^{10}$—, and in which one or more hydrogen atoms may be replaced by F, Cl, Br, I, CN, NO$_2$, or an aromatic or heteroaromatic ring system having from 1 to 40 carbon atoms, in which one or more hydrogen atoms may be replaced by F, Cl, Br, I, CN, NO$_2$, and which may be substituted by one or more nonaromatic R$^1$ radicals, where a plurality of substituents R$^1$ together may form a further mono- or polycyclic, aliphatic or aromatic ring system, and where R$^3$ with R$^1$ and/or R$^2$ may form a mono- or polycyclic, aliphatic or aromatic ring system;
R$^4$, R$^5$, R$^6$, R$^7$, R$^8$, R$^9$, R$^{10}$ are the same or different at each instance and are each H or an aliphatic or aromatic hydrocarbon radical having from 1 to 20 carbon atoms.

9. The mixture as claimed in claim 1, comprising, as the matrix material A, at least one compound of the formula (40) to (42)

Formula (40)

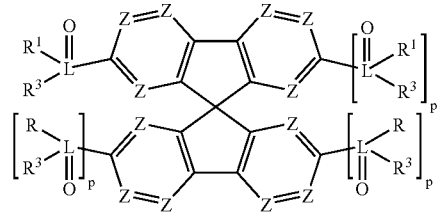

Formula (41)

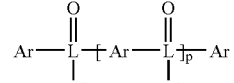

Formula (42)

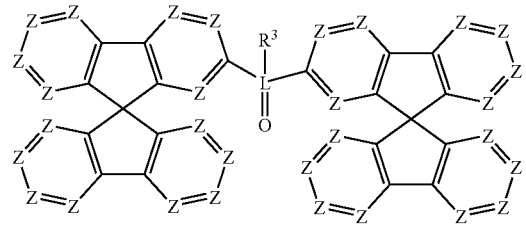

where the symbols L, R$^1$, R$^3$ and Z are each as defined as follows:
L is the same or different at each instance and is P, As, Sb or Bi;
Z is the same or different at each instance and is CR$^1$ or N;
R$^1$ is the same or different at each instance and are each H, F, Cl, Br, I, CN, NO$_2$, N(R$^3$)$_2$, a straight-chain, branched or mono-, oligo- or polycyclic alkyl, alkoxy or thioalkoxy group having from 1 to 40 carbon atoms, in which one or more nonadjacent CH$_2$ groups may be replaced by R$^4$C=CR$^4$—, —C≡C—, Si(R$^4$)$_2$, Ge(R$^5$)$_2$, Sn(R$^6$)$_2$, NR$^7$, C=O, C=S, C=Se, C=NR$^8$, —O—, —S—, —NR$^9$— or —CONR$^{10}$—, and in which one or more hydrogen atoms may be replaced by F, Cl, Br, I, CN, NO$_2$, or an aromatic or heteroaromatic ring system having from 1 to 40 carbon atoms, in which one or more hydrogen atoms may be replaced by F, Cl, Br, I, CN, NO$_2$, and which may be substituted by one or more nonaromatic R$^3$ radicals, where a plurality of substituents R$^1$ together may form a further mono- or polycyclic, aliphatic or aromatic ring system;
R$^3$ is the same or different at each instance and is a straight-chain or branched or mono-, oligo- or polycyclic alkyl, alkoxy or thioalkoxy group having from 1 to 40 carbon atoms, in which one or more nonadjacent CH$_2$ groups may be replaced by R$^4$C=CR$^4$—, —C≡C—, Si(R$^4$)$_2$, Ge(R$^5$)$_2$, Sn(R$^6$)$_2$, NR$^7$, C=O, C=S, C=Se, C=NR$^8$, —O—, —S—, —NR$^9$— or —CONR$^{10}$—, and in which one or more hydrogen atoms may be replaced by F, Cl, Br, I, CN, NO$_2$, or an aromatic or heteroaromatic ring system having from 1 to 40 carbon atoms, in which one or more hydrogen atoms may be replaced by F, Cl, Br, I, CN, NO$_2$, and which may be substituted by one or more nonaromatic R$^1$ radicals, where a plurality of substituents R$^1$ together may form a further mono- or polycyclic, aliphatic or aromatic ring system, and where R$^1$ with R$^1$ and/or R$^2$ may form a mono- or polycyclic, aliphatic or aromatic ring system;
and the further symbols and indices are:
Ar is the same or different at each instance and is a mono- or bivalent, aromatic or heteroaromatic ring system having from 2 to 40 carbon atoms, preferably having from 4 to 30 carbon atoms, in which one or more hydrogen atoms may be replaced by F, Cl, Br, I, and which may be substituted by one or more nonaromatic $R^1$ radicals, where a plurality of substituents $R^1$, either on the same ring or on different rings, together may in turn form a further mono- or polycyclic, aliphatic or aromatic ring system;

p is the same or different at each instance and is 0 or 1, and where $R^4$, $R^5$, $R^6$, $R^7$, $R^8$, $R^9$, $R^{10}$ are the same or different at each instance and are each H or an aliphatic or aromatic hydrocarbon radical having from 1 to 20 carbon atoms.

10. The mixture as claimed in claim 1, comprising, as the matrix material A, at least one compound of the formula (2), (5)-(15) and (40)-(42),

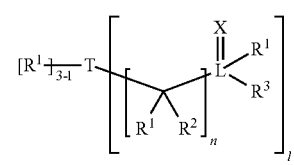

Formula (5)

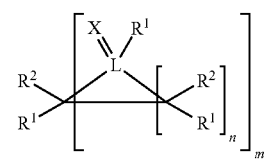

Formula (6)

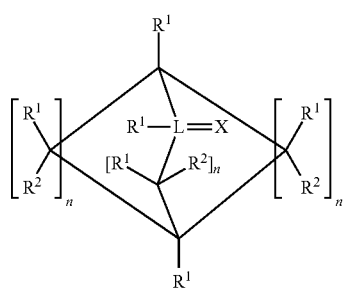

Formula (7)

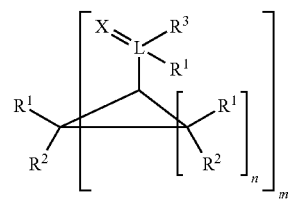

Formula (8)

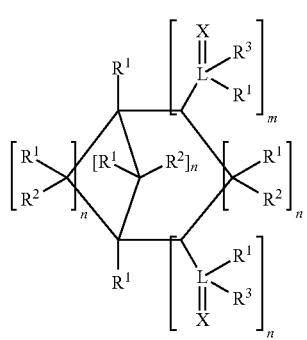

Formula (9)

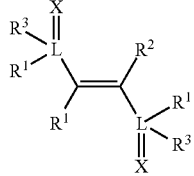

Formula (10)

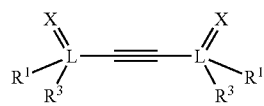

Formula (11)

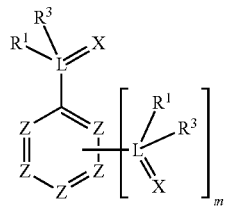

Formula (12)

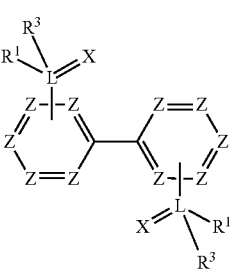

Formula (13)

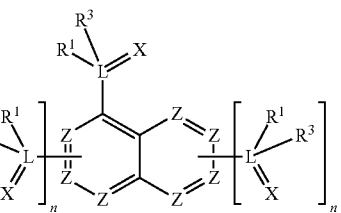

Formula (14)

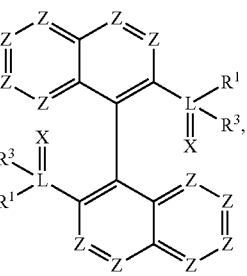

Formula (15)

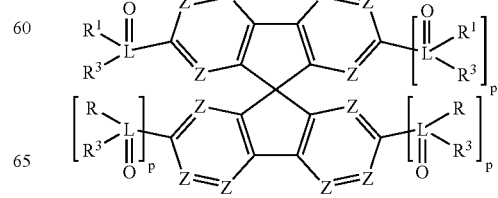

Formula (40)

-continued

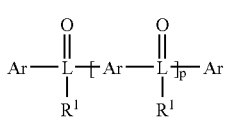
Formula (41)

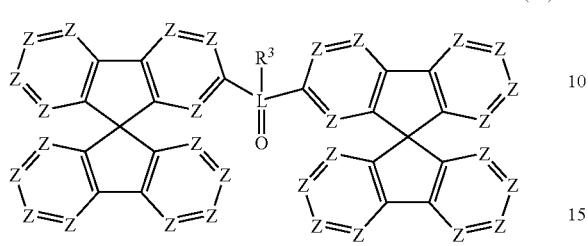
Formula (42)

wherein the symbols are as follows:
L is P at each instance;
X is O at each instance;
T is the same or different at each instance and is B, $CR^1$ or P=O;
Z is the same or different at each instance and is $CR^1$ or N;
$R^1, R^2, R^3$ are the same or different at each instance and are each $CH_3$, $CF_3$, —HC=CH— or an aromatic or heteroaromatic ring system having from 1 to 40 carbon atoms, in which one or more hydrogen atoms may be replaced by F, Cl, Br, I, and which may be substituted by one or more nonaromatic $R^1$ radicals, where a plurality of substituents $R^1$ together may form a further mono- or polycyclic, aliphatic or aromatic ring system, and where $R^3$ with $R^1$ and/or $R^2$ may form a mono- or polycyclic, aliphatic or aromatic ring system;
m is 1, 2 or 3;
n is the same or different at each instance and is 0, 1, 2 or 3;
and where the symbols and indices l, p, $R^4, R^5, R^6, R^7, R^8, R^9$ and $R^{10}$ are each as follows:
l is 1, 2 or 3;
p is the same or different at each instance and is 0 or 1;
Ar is the same or different at each instance and is a mono- or bivalent, aromatic or heteroaromatic ring system having from 2 to 40 carbon atoms, preferably having from 4 to 30 carbon atoms, in which one or more hydrogen atoms may be replaced by F, Cl, Br, I, and which may be substituted by one or more nonaromatic $R^1$ radicals, where a plurality of substituents $R^1$, either on the same ring or on different rings, together may in turn form a further mono- or polycyclic, aliphatic or aromatic ring system; and
$R^4, R^5, R^6, R^7, R^8, R^9, R^{10}$ are the same or different at each instance and are each H or an aliphatic or aromatic hydrocarbon radical having from 1 to 20 carbon atoms.

11. The mixture as claimed in claim 1, comprising one or more polymer or dendrimer as the matrix material, characterized in that the matrix material comprises one or more structural units of the formula (2), (5)-(15) and (40)-(42),

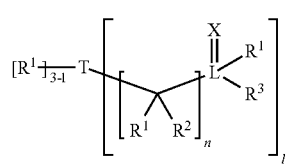
Formula (5)

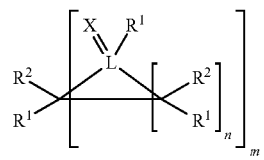
Formula (6)

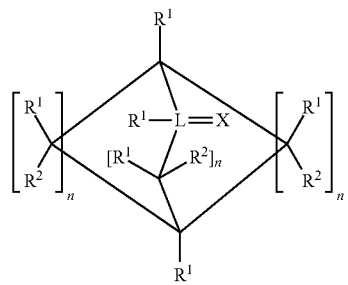
Formula (7)

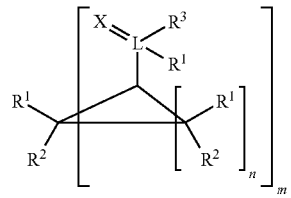
Formula (8)

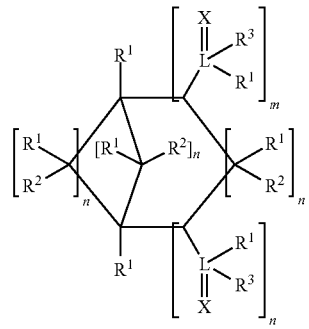
Formula (9)

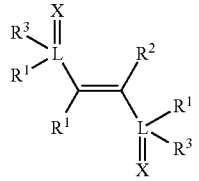
Formula (10)

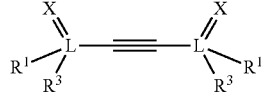
Formula (11)

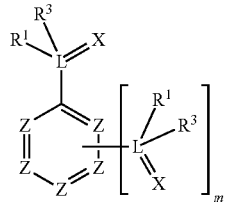
Formula (12)

-continued

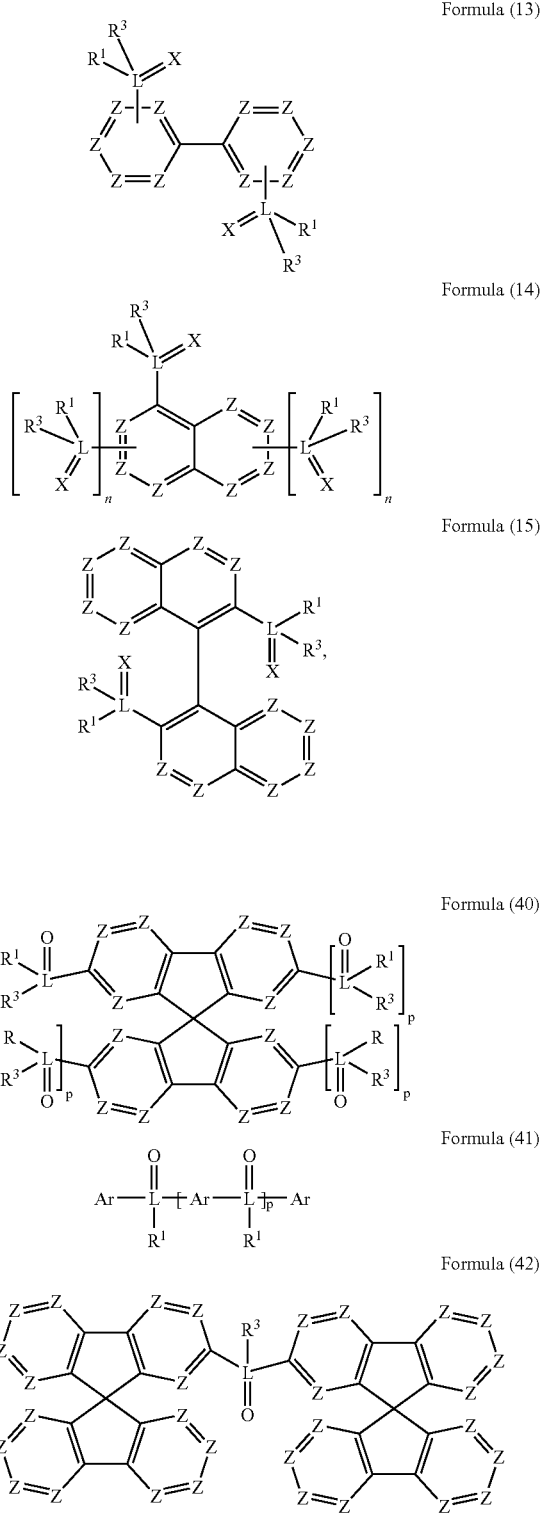

where the symbols and indices are defined as follows:
l is 1, 2 or 3;
m is 1, 2, 3, 4, 5 or 6;
n is the same or different at each instance and is 0, 1, 2, 3, 4, 5 or 6;
p is the same or different at each instance and is 0 or 1;

T is the same or different at each instance and is B, Al, CR$^1$, N, PO, As=O, Sb=O or Bi=O;
Z is the same or different at each instance and is CR$^1$ or N;
and where the symbols and indices are defined as follows:
X is the same or different at each instance and is O, S, Se or N—R$^3$;
L is the same or different at each instance and is P, As, Sb or Bi;
Ar is the same or different at each instance and is a mono- or bivalent, aromatic or heteroaromatic ring system having from 2 to 40 carbon atoms, preferably having from 4 to 30 carbon atoms, in which one or more hydrogen atoms may be replaced by F, Cl, Br, I, and which may be substituted by one or more nonaromatic R$^1$ radicals, where a plurality of substituents R$^1$, either on the same ring or on different rings, together may in turn form a further mono- or polycyclic, aliphatic or aromatic ring system;
R$^1$, R$^2$ are the same or different at each instance and are each H, F, Cl, Br, I, CN, NO$_2$, N(R$^3$)$_2$, a straight-chain, branched or mono-, oligo- or polycyclic alkyl, alkoxy or thioalkoxy group having from 1 to 40 carbon atoms, in which one or more nonadjacent CH$_2$ groups may be replaced by R$^4$C=CR$^4$—, —C≡C—, Si(R$^4$)$_2$, Ge(R$^5$)$_2$, Sn(R$^6$)$_2$, NR$^7$, C=O, C=S, C=Se, C=NR$^8$, —O—, —S—, —NR$^9$— or —CONR$^{10}$—, and in which one or more hydrogen atoms may be replaced by F, Cl, Br, I, CN, NO$_2$, or an aromatic or heteroaromatic ring system having from 1 to 40 carbon atoms, in which one or more hydrogen atoms may be replaced by F, Cl, Br, I, CN, NO$_2$, and which may be substituted by one or more nonaromatic R$^1$ radicals, where a plurality of substituents R$^1$ together may form a further mono- or polycyclic, aliphatic or aromatic ring system;
R$^3$ is the same or different at each instance and is a straight-chain or branched or mono-, oligo- or polycyclic alkyl, alkoxy or thioalkoxy group having from 1 to 40 carbon atoms, in which one or more nonadjacent CH$_2$ groups may be replaced by R$^4$C=CR$^4$—, —C≡C—, Si(R$^4$)$_2$, Ge(R$^5$)$_2$, Sn(R$^6$)$_2$, NR$^7$, C=O, C=S, C=Se, C=NR$^8$, —O—, —S—, —NR$^9$— or —CONR$^{10}$—, and in which one or more hydrogen atoms may be replaced by F, Cl, Br, I, CN, NO$_2$, or an aromatic or heteroaromatic ring system having from 1 to 40 carbon atoms, in which one or more hydrogen atoms may be replaced by F, Cl, Br, I, CN, NO$_2$, and which may be substituted by one or more nonaromatic R$^1$ radicals, where a plurality of substituents R$^1$ together may form a further mono- or polycyclic, aliphatic or aromatic ring system, and where R$^3$ with R$^1$ and/or R$^2$ may form a mono- or polycyclic, aliphatic or aromatic ring system; and
R$^4$, R$^5$, R$^6$, R$^7$, R$^8$, R$^9$, R$^{10}$ are the same or different at each instance and are each H or an aliphatic or aromatic hydrocarbon radical having from 1 to 20 carbon atoms.

12. The mixture as claimed in claim 11, characterized in that the polymer is conjugated, part-conjugated or nonconjugated.

13. The mixture as claimed in claim 11, characterized in that the polymer is selected from the polyfluorenes, polyspirobifluorenes, polyparaphenylenes, polycarbazoles, polyvinylcarbazoles, or polythiophenes.

14. A mixture of claim 11, further comprising at least one matrix material A, wherein the polymer is conjugated, part-conjugated or nonconjugated.

15. A mixture of claim 11, further comprising at least one matrix material A, wherein the polymer is selected from the polyfluorenes, polyspirobifluorenes, polyparaphenylenes, polycarbazoles, polyvinylcarbazoles, or polythiophenes.

16. The mixture according to claim 1, wherein the mixture consists essentially of at least one matrix material A and at least one emission material B.

17. The mixture according to claim 1, wherein the at least one emission material B comprises at least one compound of the formula (51) to (52).

* * * * *